(12) United States Patent
Fukano et al.

(10) Patent No.: US 11,769,651 B2
(45) Date of Patent: Sep. 26, 2023

(54) HIGH-FREQUENCY POWER SUPPLY DEVICE AND OUTPUT METHOD OF HIGH-FREQUENCY POWER

(71) Applicant: DAIHEN Corporation, Osaka (JP)

(72) Inventors: Katsuyuki Fukano, Osaka (JP); Yuya Nakamori, Osaka (JP); Koji Itadani, Osaka (JP); Satoru Hamaishi, Osaka (JP)

(73) Assignee: DAIHEN Corporation, Osaka (JP)

( * ) Notice: Subject to any disclaimer, the term of this patent is extended or adjusted under 35 U.S.C. 154(b) by 651 days.

(21) Appl. No.: 17/012,590

(22) Filed: Sep. 4, 2020

(65) Prior Publication Data

US 2021/0098237 A1   Apr. 1, 2021

(30) Foreign Application Priority Data

Sep. 26, 2019   (JP) .................................. 2019-176060

(51) Int. Cl.
*H01J 37/32* (2006.01)
*H03H 7/40* (2006.01)

(52) U.S. Cl.
CPC .. *H01J 37/32266* (2013.01); *H01J 37/32183* (2013.01); *H03H 7/40* (2013.01); *H01J 2237/327* (2013.01); *H01J 2237/334* (2013.01)

(58) Field of Classification Search
CPC ........... H01J 37/32266; H01J 37/32183; H01J 2237/327
See application file for complete search history.

(56) References Cited

U.S. PATENT DOCUMENTS 7,251,121 B2   7/2007   Bhutta
7,298,128 B2   11/2007   Bhutta
(Continued)

FOREIGN PATENT DOCUMENTS

JP   2013-214583 A   10/2013
JP   2015-090759 A   5/2015
(Continued)

OTHER PUBLICATIONS

Notice of Reasons for Refusal for Japanese Application No. 2019-176060 dated Jan. 24, 2023, with its English translation, 16 pages.
(Continued)

*Primary Examiner* — Joseph L Williams
(74) *Attorney, Agent, or Firm* — Bret E. Field; Bozicevic, Field & Francis LLP

(57) ABSTRACT

A high-frequency power supply device generates a high-frequency signal, periodically controls the amplitude or phase of the generated high-frequency signal, and outputs high-frequency power, magnitude of which is controlled on the basis of the high-frequency signal, amplitude or phase of which has been controlled. The high-frequency power supply device controls the amplitude or phase of the high-frequency signal such that the magnitude of the high-frequency power is a first level in a first period of a control cycle and is a second level in a second period of the control cycle which is different from the first period. The second level is lower than the first level. The high-frequency power supply device gradually decreases or increases at least one of the second level and the ratio of the length of the first period to the length of the control cycle, and gradually increases or decreases the first level.

6 Claims, 12 Drawing Sheets

(56) References Cited

U.S. PATENT DOCUMENTS

| | | |
|---|---|---|
| 9,196,459 B2 | 11/2015 | Bhutta |
| 9,306,533 B1 | 4/2016 | Mavretic |
| 9,345,122 B2 | 5/2016 | Bhutta |
| 9,496,122 B1 | 11/2016 | Bhutta |
| 9,525,412 B2 | 12/2016 | Mavretic |
| 9,543,122 B2 | 1/2017 | Bhutta |
| 9,584,090 B2 | 2/2017 | Mavretic |
| 9,591,739 B2 | 3/2017 | Bhutta |
| 9,697,991 B2 | 7/2017 | Bhutta |
| 9,728,378 B2 | 8/2017 | Bhutta et al. |
| 9,729,122 B2 | 8/2017 | Mavretic |
| 9,745,660 B2 | 8/2017 | Bhutta |
| 9,755,641 B1 | 9/2017 | Bhutta |
| 9,831,064 B2 | 11/2017 | Konno et al. |
| 9,844,127 B2 | 12/2017 | Bhutta |
| 9,865,432 B1 | 1/2018 | Bhutta |
| 10,026,594 B2 | 7/2018 | Bhutta |
| 10,192,721 B2 | 1/2019 | Kasai |
| 10,217,608 B2 | 2/2019 | Mavretic |
| 10,340,879 B2 | 7/2019 | Mavretic et al. |
| 10,431,424 B2 | 10/2019 | Mavretic et al. |
| 10,431,428 B2 | 10/2019 | Bhutta et al. |
| 10,454,453 B2 | 10/2019 | Bhutta et al. |
| 10,455,729 B2 | 10/2019 | Bhutta |
| 10,460,912 B2 | 10/2019 | Bhutta et al. |
| 10,483,090 B2 | 11/2019 | Bhutta et al. |
| 10,727,029 B2 | 7/2020 | Ulrich et al. |
| 2011/0032047 A1 | 2/2011 | Yuzurihara et al. |
| 2015/0122420 A1 | 5/2015 | Konno et al. |
| 2016/0065207 A1 | 3/2016 | Bhutta |
| 2016/0380610 A1 | 12/2016 | Ulrich |
| 2017/0178865 A1 | 6/2017 | Ulrich |
| 2017/0352523 A1 | 12/2017 | Kasai |
| 2018/0076788 A1 | 3/2018 | Decker et al. |
| 2019/0108977 A1 | 4/2019 | Wei et al. |
| 2019/0172683 A1 | 6/2019 | Mavretic et al. |
| 2019/0267212 A1 | 8/2019 | Mavretic |
| 2019/0272978 A1 | 9/2019 | Ahmed et al. |
| 2019/0326094 A1 | 10/2019 | Bhutta |

FOREIGN PATENT DOCUMENTS

| | | |
|---|---|---|
| JP | 2017-22136 A | 1/2017 |
| JP | 2017-201630 A | 11/2017 |
| JP | 2019-516273 A | 6/2019 |
| WO | WO2011016266 A1 | 2/2011 |
| WO | WO2018093537 A1 | 5/2018 |

OTHER PUBLICATIONS

Notice of Reasons for Refusal for Japanese Application No. 2019-176060 dated Jun. 13, 2023, with its English translation, 12 pages.

FIG. 4

| DUTY RATIO(%) | | 100 | 75 | 50 | 25 |
|---|---|---|---|---|---|
| FIRST LEVEL | POWER(W) | 1000 | 1167 | 1500 | 2500 |
| | PHASE DIFFERENCE | $\theta 11$ | $\theta 12$ | $\theta 13$ | $\theta 14$ |
| | PULSE LEVEL | 1.000 | 1.080 | 1.225 | 1.581 |
| SECOND LEVEL | POWER(W) | 1000 | 600 | 600 | 600 |
| | PHASE DIFFERENCE | $\theta 21 = \theta 11$ | $\theta 22$ | $\theta 23$ | $\theta 24$ |
| | PULSE LEVEL | 1.000 | 0.775 | 0.775 | 0.775 |

FIG.7

| DUTY RATIO(%) | | 100 | 75 | 50 | 25 |
|---|---|---|---|---|---|
| FIRST LEVEL | POWER(W) | 1000 | 1056 | 1333 | 2500 |
| | PHASE DIFFERENCE | $\theta 31$ | $\theta 32$ | $\theta 33$ | $\theta 34$ |
| | PULSE LEVEL | 1.000 | 1.028 | 1.155 | 1.581 |
| SECOND LEVEL | POWER(W) | 1000 | 933 | 766 | 600 |
| | PHASE DIFFERENCE | $\theta 41 = \theta 31$ | $\theta 42$ | $\theta 43$ | $\theta 44$ |
| | PULSE LEVEL | 1.000 | 0.966 | 0.875 | 0.775 |

FIG. 9

| DUTY RATIO(%) | | 25 | 25 | 25 | 25 | 25 |
|---|---|---|---|---|---|---|
| FIRST LEVEL | POWER(W) | 1000 | 1375 | 1750 | 2125 | 2500 |
| | PHASE DIFFERENCE | $\theta 51$ | $\theta 52$ | $\theta 53$ | $\theta 54$ | $\theta 55$ |
| | PULSE LEVEL | 1.000 | 1.173 | 1.323 | 1.458 | 1.581 |
| SECOND LEVEL | POWER(W) | 1000 | 975 | 850 | 725 | 600 |
| | PHASE DIFFERENCE | $\theta 61 = \theta 51$ | $\theta 62$ | $\theta 63$ | $\theta 64$ | $\theta 65$ |
| | PULSE LEVEL | 1.000 | 0.987 | 0.922 | 0.851 | 0.775 |

HIGH-FREQUENCY POWER SUPPLY DEVICE AND OUTPUT METHOD OF HIGH-FREQUENCY POWER

CROSS-REFERENCE TO RELATED APPLICATION

This Nonprovisional application claims priority under 35 U.S.C. § 119(a) on Patent Application No. 2019-176060 filed in Japan on Sep. 26, 2019, the entire contents of which are hereby incorporated by reference.

FIELD

The present disclosure relates to a high-frequency power supply device and an output method of a high-frequency power that supply high-frequency power to a plasma processing apparatus.

BACKGROUND

There are various methods for supplying high-frequency power to a plasma processing apparatus used for manufacturing, for example, semiconductor devices. In one method, high-frequency power having a relatively high frequency which is suitable for generating plasma is supplied from a first power supply to an upper electrode. In addition, high-frequency power having a relatively low frequency which is suitable for attracting ions in plasma in the object to be processed is supplied from a second power supply to a lower electrode.

Hereinafter, an on or high level is generically referred to as a first level. An off or low level is generically referred to as a second level. Japanese Patent Laid-Open Publication No. 2015-90759 discloses a technique for suppressing charging damage to a substrate to be processed. In this technique, amplitude shift keying is performed on the high-frequency power of a first power supply to modulate the high-frequency power to a first level/a second level at a predetermined frequency, thereby reducing the time required for continuously generating plasma. Therefore, charging damage to the substrate to be processed is suppressed. In addition, the high-frequency power of a second power supply is modulated to the first level/the second level at a second frequency to interrupt the time during which the etching of a predetermined film on the substrate to be processed proceeds. Therefore, a so-called micro-loading effect is decreased and it is possible to perform etching at a high etching rate (the amount of etching per hour).

Processing conditions relating to, for example, a plasma state are sequentially switched in each processing step according to a so-called recipe. For example, in a case in which plasma is generated intermittently, the magnitude of the high-frequency power for generating the plasma is periodically modulated to the first level/the second level (see Japanese Patent Laid-Open Publication No. 2013-214583).

SUMMARY

However, in the techniques disclosed in Japanese Patent Laid-Open Publication No. 2015-90759 and Japanese Patent Laid-Open Publication No. 2013-214583, the high-frequency power changes discontinuously from an unmodulated state to an amplitude-shift-keyed state.

Further, the magnitude of the high-frequency power changes stepwise from the first level and the second level to a third level and a fourth level. Therefore, there is a possibility that the generation conditions of ions or radicals in the plasma will suddenly change and the plasma will become unstable.

The present disclosure has been made in view of the above-mentioned problems and an object of the present disclosure is to provide a high-frequency power supply device and an output method of a high-frequency power that can mitigate a sudden change in high-frequency power.

A high-frequency power supply device according to an aspect of the present disclosure, includes: a high-frequency generation unit that generates a high-frequency signal; a control unit that periodically controls an amplitude or phase of the high-frequency signal generated by the high-frequency generation unit; and a high-frequency output unit that outputs high-frequency power, magnitude of which is controlled on the basis of the high-frequency signal, the amplitude or phase of which is controlled by the control unit. The control unit controls the amplitude or phase of the high-frequency signal such that the magnitude of the high-frequency power output by the high-frequency output unit is a first level in a first period of a control cycle and is a second level in a second period of the control cycle which is different from the first period, the second level being lower than the first level. The control unit gradually decreases or increases at least one of the second level and a ratio of a length of the first period to a length of the control cycle. In a case in which at least one of the second level and the ratio is gradually decreased, the control unit gradually increases the first level such that an average value of the high-frequency power output by the high-frequency output unit is constant. In a case in which at least one of the second level and the ratio is gradually increased, the control unit gradually decreases the first level such that the average value of the high-frequency power output by the high-frequency output unit is constant.

In an output method of high-frequency power according to an aspect of the present disclosure, high-frequency power, magnitude of which is controlled on the basis of a high frequency signal, an amplitude or phase of which is controlled periodically, is output. The output method includes: controlling the amplitude or phase of the high-frequency signal such that the magnitude of the high-frequency power is a first level in a first period of a control cycle and is a second level in a second period of the control cycle which is different from the first period, the second level being lower than the first level; gradually decreasing or increasing at least one of the second level and a ratio of a length of the first period to a length of the control cycle; gradually increasing the first level such that an average value of the high-frequency power is constant in a case in which the at least one of the second level and the ratio is gradually decreased; and gradually decreasing the first level such that the average value of the high-frequency power is constant in a case in which the at least one of the second level and the ratio is gradually increased.

In this aspect, the control unit periodically controls the amplitude or phase of the high-frequency signal generated by the high-frequency generation unit such that the magnitude of the high-frequency power output by the high-frequency output unit is periodically adjusted to the first level and the second level in the first period and in the second period respectively. The second level is lower than the first level. In addition, the control unit gradually decreases or increases at least one of the second level and the duty ratio of the first period to the control cycle and gradually increases or decreases the first level, while periodically controlling the amplitude or phase of the high-frequency signal. Therefore, the average value of the high-frequency power output by the high-frequency output unit is kept constant. That is, when gradually decreasing at least one of the second level and the duty ratio, the control unit gradually increases the first level. When gradually increasing at least one of the second level and the duty ratio, the control unit gradually decreases the first level. Therefore, the average value of the high-frequency power is kept constant.

In a high-frequency power supply device according to an aspect of the present disclosure, the high-frequency generation unit generates a plurality of the high-frequency signals including a first high-frequency signal and a second high-frequency signal which have the same frequency. The control unit controls a phase difference between the first high-frequency signal and the second high-frequency signal in each of the first period and the second period. The high-frequency output unit includes: a first generation unit that generates a first high-frequency voltage having a phase corresponding to the first high-frequency signal; a second generation unit that generates a second high-frequency voltage having a phase corresponding to the second high-frequency signal; and a power combination unit that combines high-frequency powers based on the first high-frequency voltage and the second high-frequency voltage respectively at a ratio corresponding to the phase difference, the first high-frequency voltage and the second high-frequency voltage being generated by the first generation unit and the second generation unit.

In this aspect, the high-frequency generation unit generates the first high-frequency signal and the second high-frequency signal which have the same frequency. The control unit controls the phase difference between the first high-frequency signal and the second high-frequency signal in each of the first period and the second period. The high-frequency output unit generates the first high-frequency voltage having a phase corresponding to the first high-frequency signal and generates the second high-frequency voltage having a phase corresponding to the second high-frequency signal. In addition, the high-frequency output unit combines the high-frequency power based on the generated first high-frequency voltage and the high-frequency power based on the generated second high-frequency voltage at a ratio corresponding to the phase difference between the first high-frequency voltage and the second high-frequency voltage. The high-frequency output unit outputs the combined high-frequency power. Since the high-frequency power based on the high-frequency voltage and the high-frequency power based on the second high-frequency voltage are combined at different ratios in the first period and the second period, the magnitudes of the high-frequency powers output in the first period and in the second period respectively are changed to the first level and the second level respectively.

In a high-frequency power supply device according to an aspect of the present disclosure, the control unit controls the amplitude of the high-frequency signal in each of the first period and the second period. The high-frequency output unit outputs high-frequency power having a magnitude corresponding to the high-frequency signal, amplitude of which is controlled by the control unit.

In this aspect, the control unit controls the amplitude of the high-frequency signal generated by the high-frequency generation unit in each of the first period and the second period. The high-frequency output unit generates high-frequency power having a magnitude corresponding to the high-frequency signal, amplitude of which has been controlled. Therefore, the magnitudes of the high-frequency powers output in the first period and in the second period respectively are changed to the first level and the second level respectively.

A high-frequency power supply device according to an aspect of the present disclosure, further includes a power detection unit that detects the high-frequency power output by the high-frequency output unit. The control unit adjusts the amplitude or phase of the high-frequency signal such that magnitudes of the high-frequency powers detected by the power detection unit in the first period and in the second period respectively are equal to the first level and the second level respectively In this aspect, the high-frequency powers output from the high-frequency output unit in the first period and in the second period respectively are detected. The control unit controls the amplitude or phase of the high-frequency signal such that the magnitudes of the detected high-frequency powers are equal to the first level and the second level respectively. The first level and the second level are the target values of the high-frequency powers to be output by the high-frequency output unit in the first period and in the second period respectively. Therefore, the magnitude of the high-frequency power output in each control cycle is accurately adjusted.

A high-frequency power supply device according to an aspect of the present disclosure includes: a high-frequency generation unit that generates a first high-frequency signal and a second high-frequency signal; a control unit that periodically controls amplitudes or phases of the first high-frequency signal and the second high-frequency signal which are generated by the high-frequency generation unit; a first high-frequency output unit that outputs high-frequency power, magnitude of which is controlled on the basis of the first high-frequency signal, the amplitude or phase of which is controlled by the control unit; and a second high-frequency output unit that outputs high-frequency power, magnitude of which is controlled on the basis of the second high-frequency signal, the amplitude or phase of which is controlled by the control unit. The control unit controls the amplitude or phase of the first high-frequency signal such that the magnitude of the high-frequency power output by the first high-frequency output unit is a first level in a first period of a control cycle. The control unit controls the amplitude or phase of the second high-frequency signal such that the magnitude of the high-frequency power output by the second high-frequency output unit is a second level in a second period of the control cycle which is different from the first period, the second level being lower than the first level. The control unit gradually decreases or increases at least one of the second level and a ratio of a length of the first period to a length of the control cycle. In a case in which the at least one of the second level and the ratio is gradually decreased, the control unit gradually increases the first level such that an average value of a synthesis of the high-frequency powers output by the first high-frequency output unit and the second high-frequency output unit is constant. In a case in which the at least one of the second level and the ratio is gradually increased, the control unit gradually decreases the first level such that the average value of the synthesis of the high-frequency powers output by the first high-frequency output unit and the second high-frequency output unit is constant.

In this aspect, the control unit periodically controls the amplitude or phase of the first high-frequency signal and the second high-frequency signal which are generated by the high-frequency generation unit. The first high-frequency output unit outputs high-frequency power on the basis of the first high-frequency signal, amplitude or phase of which is controlled. The second high-frequency output unit outputs high-frequency power on the basis of the second high-frequency signal, amplitude or phase of which is controlled. The magnitude of the high-frequency power output by the first high-frequency output unit is periodically adjusted to the first level in the first period. The magnitude of the high-frequency power output by the second high-frequency output unit is periodically adjusted to the second level in the second period. The second level is lower than the first level. In addition, the control unit gradually decreases or increases at least one of the second level and the duty ratio of the first period to the control cycle, and gradually increases or decreases the first level, while periodically controlling the amplitude or phase of the first high-frequency signal and the second high-frequency signal. Therefore, the average value of the synthesis of the high-frequency power output by the first high-frequency output unit and the high-frequency power output by the second high-frequency output unit is kept constant. That is, when gradually decreasing at least one of the second level and the duty ratio, the control unit gradually increases the first level. When gradually increasing at least one of the second level and the duty ratio, the control unit gradually decreases the first level. Therefore, the average value of the synthesis of the high-frequency power is kept constant.

According to the present disclosure, it is possible to mitigate a sudden change in the high-frequency power.

The above and further objects and features will move fully be apparent from the following detailed description with accompanying drawings.

BRIEF DESCRIPTION OF THE DRAWINGS

FIG. 4 is a diagram illustrating a correspondence relationship between a duty ratio and a phase difference used in the high-frequency power supply device according to Embodiment 1.

FIG. 7 is a diagram illustrating a correspondence relationship between a duty ratio and a phase difference used in the high-frequency power supply device according to Modification Example 1.

FIG. 9 is a diagram illustrating a correspondence relationship between a duty ratio and a phase difference used in the high-frequency power supply device according to Modification Example 2.

DETAILED DESCRIPTION OF NON-LIMITING EXAMPLE EMBODIMENTS

Hereinafter, the present disclosure will be described in detail with reference to the drawings illustrating embodiments.

Embodiment 1

Figure 1:
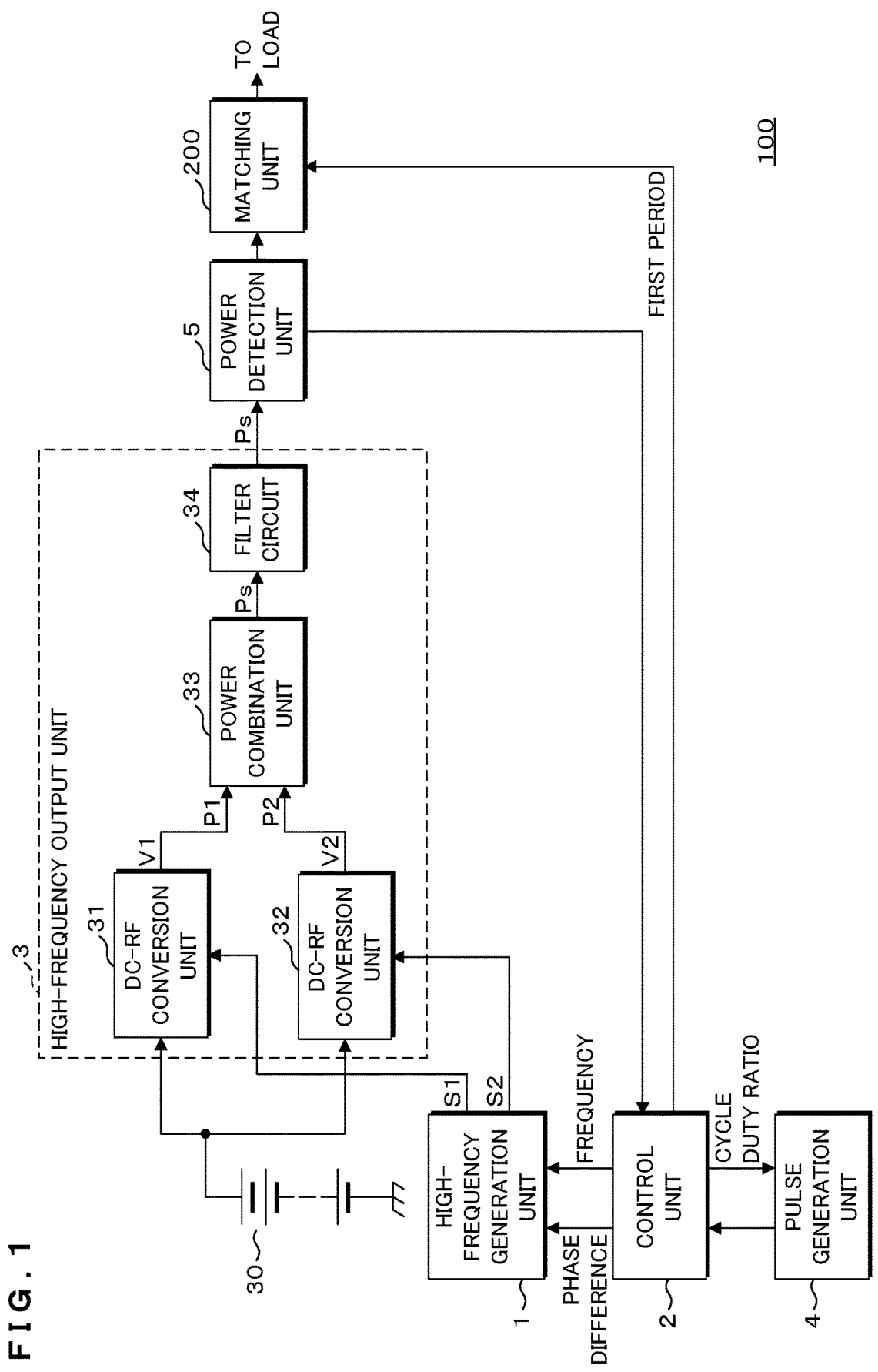
FIG. 1 is a block diagram illustrating an example of the configuration of a high-frequency power supply device according to Embodiment 1.

FIG. 1 is a block diagram illustrating an example of the configuration of a high-frequency power supply device 100 according to Embodiment 1. The high-frequency power supply device 100 includes a high-frequency generation unit 1, a control unit 2, and a high-frequency output unit 3. The high-frequency generation unit 1 generates high-frequency signals S1 and S2 which have the same frequency. The high-frequency signals S1 and S2 correspond to a first high-frequency signal and a second high-frequency signal respectively. The control unit 2 controls the phases of the high-frequency signals S1 and S2 which are generated by the high-frequency generation unit 1. The high-frequency output unit 3 outputs high-frequency power Ps, magnitude of which is adjusted on the basis of the high-frequency signals S1 and S2, phases of which is controlled.

The high-frequency power supply device 100 further includes a pulse generation unit 4 and a power detection unit 5. The pulse generation unit 4 generates a pulse for notifying the timing when the control unit 2 controls the phases of the high-frequency signals S1 and S2. The power detection unit 5 detects the high-frequency power output by the high-frequency output unit 3. The high-frequency power output by the high-frequency output unit 3 is supplied to a load, such as a plasma processing apparatus, through the power detection unit 5 and a matching unit 200. The matching unit 200 achieves impedance matching with the load.

The high-frequency generation unit 1 is configured by, for example, a direct digital synthesizer. The voltage of the high-frequency signal S1 generated by the high-frequency generation unit 1 is represented by $v(t)=A \sin(2\pi ft+\phi 1)$. The voltage of the high-frequency signal S2 generated by the high-frequency generation unit 1 is represented by $v(t)=A \sin(2\pi ft+\phi 2)$. Here, A is, for example, a constant amplitude. In addition, f is a frequency set by the control unit 2 and is, for example, a frequency of 2 MHz, 13.56 MHz, 27 MHz, of 60 MHz in an industrial radio frequency (RF) band. Further, $\phi 2-\phi 1$ (or $\phi 1-\phi 2$) is a phase difference between the high-frequency signal S1 and the high-frequency signal S2. $\phi 2-\phi 1$ (or $\phi 1-\phi 2$) is adjusted to a phase difference $\theta$ set by the control unit 2. In a case in which the control unit 2 sets the phases $\phi 1$ and $\phi 2$ in the high-frequency generation unit 1, the high-frequency generation unit 1 may perform adjustment such that the phase difference between the high-frequency signal S1 and the high-frequency signal S2 satisfies $\theta=\phi 2-\phi 1$ (or $\phi 1-\phi 2$).

The control unit 2 has a central processing unit (CPU) (not illustrated). The control unit 2 controls the operation of each unit according to a control program stored in advance in a read only memory (ROM) and performs processes, such as an input/output process and a calculation process. Temporarily generated information is stored in a random access memory (RAM). For example, a computer program that defines the procedure of each process performed by the CPU is loaded to the RAM in advance using a means (not illustrated) and the CPU executes the loaded computer program. It is noted that the control unit 2 may be configured by a microcomputer or a dedicated hardware circuit.

The high-frequency output unit 3 includes DC-RF conversion units 31 and 32 and a power combination unit 33. The DC-RF conversion unit 31 generates a high-frequency voltage V1 with a phase corresponding to the high-frequency signal S1 generated by the high-frequency generation unit 1. The DC-RF conversion unit 32 generates a high-frequency voltage V2 with a phase corresponding to the high-frequency signal S2 generated by the high-frequency generation unit 1. The high-frequency voltages V1 and V2 correspond to a first high-frequency voltage and a second high-frequency voltage respectively. The power combination unit 33 combines high-frequency power P1 based on the high-frequency voltage V1 generated by the DC-RF conversion unit 31 and high-frequency power P2 based on the high-frequency voltage V2 generated by the DC-RF conversion unit 32. A direct-current power supply 30 supplies direct-current power to the DC-RF conversion units 31 and 32. A filter circuit 34 removes a high-frequency component of high-frequency power Ps combined by the power combination unit 33. After the high-frequency component is removed, a fundamental wave component of the high-frequency power Ps is output to the load.

Each of the DC-RF conversion units 31 and 32 includes, for example, a half-bridge-type class-D amplifier, a capacitor, and an LC low-pass filter. The capacitor cuts a direct current included in the output of the class-D amplifier. The LC low-pass filter removes harmonics included in the output of the class-D amplifier. The high-frequency voltage V1 generated by the DC-RF conversion unit 31 is represented by $v(t)=B\ \sin(2\pi ft+\theta 1)$. The high-frequency voltage V2 generated by the DC-RF conversion unit 32 is represented by $v(t)=B\ \sin(2\pi ft+\theta 2)$. Here, B is a constant amplitude corresponding to the voltage of the direct-current power supply 30. The phase difference $\theta 2-\theta 1$ (or $\theta 1-\theta 2$) between the high-frequency voltage V1 and the high-frequency voltage V2 is equal to the phase difference $\theta$ between the high-frequency signal S1 and the high-frequency signal S2.

As described above, the high-frequency power P1 is based on the first high-frequency voltage V1 generated by the DC-RF conversion unit 31. The high-frequency power P2 is based on the second high-frequency voltage V2 generated by the DC-RF conversion unit 32. The power combination unit 33 combines the high-frequency power P1 and the high-frequency power P2 according to the phase difference between the high-frequency voltage V1 and the high-frequency voltage V2, that is, the phase difference between the high-frequency signal S1 and the high-frequency signal S2. In this way, the power combination unit 33 adjusts the magnitude of the high-frequency power Ps that is output. Hereinafter, the power combination unit 33 will be described.

Figure 2:
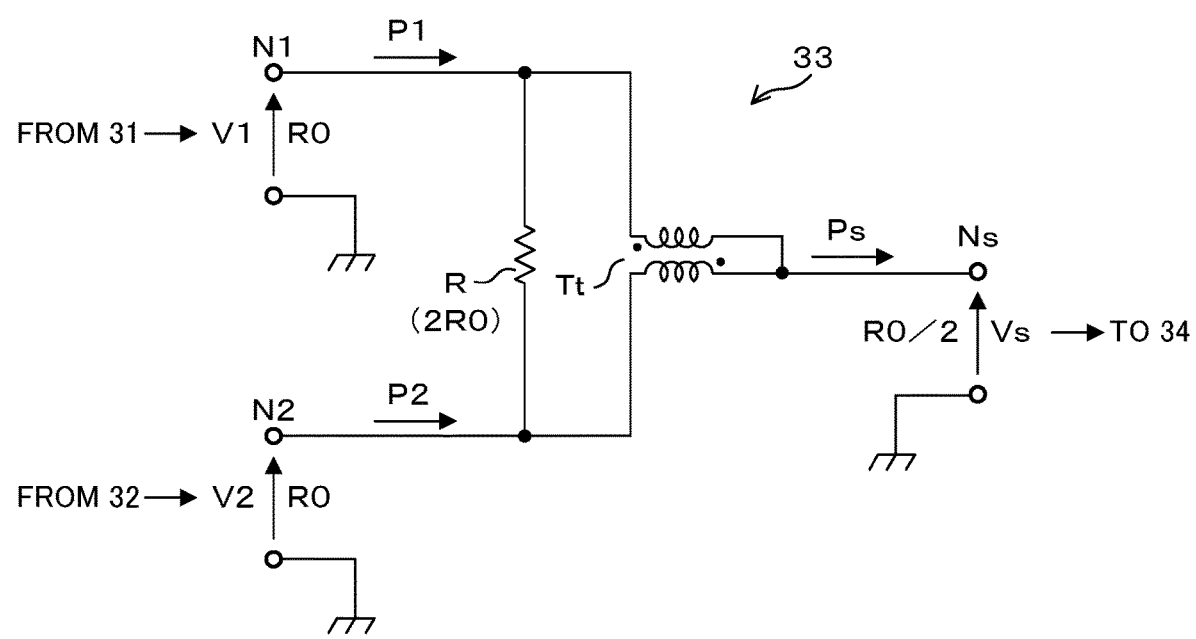
FIG. 2 is a circuit diagram illustrating an example of the configuration of a power combination unit.

FIG. 2 is a circuit diagram illustrating an example of the configuration of the power combination unit 33. The power combination unit 33 includes a hybrid circuit including a resistor R and a transmission transformer Tt. For the transmission transformer Tt, the ratio of the number of turns in a first coil to the number of turns in a second coil is 1:1. The power combination unit 33 further includes two input ports N1 and N2 and one sum port Ns. The high-frequency voltage V1 is applied to the input port N1. The high-frequency voltage V2 is applied to the input port N2.

One end of the input port N1 is connected to one end of the resistor R and one end of the transmission transformer Tt at which the winding of the first coil starts. The other end of the first coil of the transmission transformer Tt is connected to one end at which the winding of the second coil starts and to one end of the sum port Ns. The other end of the second coil of the transmission transformer Tt is connected to the other end of the resistor R and one end of the input port N2. The other ends of the input ports N1 and N2 and the sum port Ns are connected to the ground potential.

A load is connected to the sum port Ns. It is known that, in a case in which the impedance of the load is R0/2 and the resistance value of the resistor R is set to 2R0, the input impedance of each of the input ports N1 and N2 is R0. The details are described in Japanese Patent Laid-Open Publication No. 2017-201630. The high-frequency power P1 is input from the input port N1. The high-frequency power P2 is input from the input port N2. The high-frequency power P1 is represented by the following Expression (1) using the above-mentioned voltage formula indicating the high-frequency voltage V1. The high-frequency power P2 is represented by the following Expression (2) using the above-mentioned voltage formula indicating the high-frequency voltage V2.

$$P1=B^2\ \sin^2(2\pi ft+\theta 1)/R0 \qquad (1)$$

$$P2=B^2\ \sin^2(2\pi ft+\theta 2)/R0 \qquad (2)$$

In Japanese Patent Laid-Open Publication No. 2017-201630, currents flowing to the input ports N1 and N2 and a current flowing through the resistor R are calculated by using the above-mentioned voltage formulae indicating the high-frequency voltages V1 and V2. Then, currents flowing through the first coil and the second coil of the transmission transformer Tt are calculated and a current output from the sum port Ns is calculated. As a result, a high-frequency voltage Vs and the high-frequency power Ps output from the sum port Ns are represented by the following Expressions (3) and (4) respectively. Therefore, an average value Ps_avr of the high-frequency power Ps is represented by the following Expression (5).

$$Vs=B\ \cos(\theta/2)\cdot\sin(2\pi ft+\theta/2) \qquad (3)$$

$$Ps=Vs^2/(R0/2)=2B^2\ \cos^2(\theta/2)\cdot\sin^2(2\pi ft+\theta/2)/R0 \qquad (4)$$

$$Ps\_avr=B^2\ \cos^2(\theta/2)/R0 \qquad (5)$$

where $\theta\cdot\theta 2-\theta 1$

The comparison among Expressions (1), (2), and (4) shows that the ratio $\eta$ of the high-frequency power Ps output from the power combination unit 33 to the high-frequency power (P1+P2) input to the power combination unit 33 is represented by the following Expression (6). The remaining high-frequency power is consumed by the resistor R. In a case in which the ratio $\eta$ for combining the high-frequency power P1 and the high-frequency power P2 is determined in advance, the phase difference $\theta$ is calculated by the following Expression (7).

$$\eta 32\ \cos^2(\theta/2) \qquad (6)$$

$$\theta=2\ \arccos(\sqrt{\eta}) \qquad (7)$$

Even in a case in which the impedance of the load connected to the sum port Ns is different from Ro/2, the phase difference $\theta$ is changed in the range of 0 to $2\pi$ to adjust the magnitude of the high-frequency power Ps output from the power combination unit 33.

The configuration of the power combination unit 33 is not limited to the configuration illustrated in FIG. 2. For example, the power combination unit 33 may be configured to combine the high-frequency power P1 and the high-frequency power P2 using a so-called 90° hybrid circuit. In the following description, power loss that occurs in the filter circuit 34 is ignored. In this case, the high-frequency power Ps output by the power combination unit 33 is output from the high-frequency output unit 3 in a state in which the magnitude thereof is maintained.

The pulse generation unit 4 illustrated in FIG. 1 has a timer that is provided in a general-purpose timer IC, a microcomputer or the like. The pulse generation unit 4 generates a pulse having a cycle and a duty ratio which are set by the control unit 2. A peak value of the pulse is a so-called logic level. The cycle of the pulse is sufficiently longer than a cycle represented by the reciprocal of the frequency f. The frequency f is set in the high-frequency generation unit 1 by the control unit 2. The pulse generation unit 4 gives the generated pulse to the control unit 2 to periodically notify the control unit 2 of the start time of the on period of the pulse and the start time of the off period of the pulse.

For convenience, the pulse generation unit 4 notifies the control unit 2 of two start times even in a case in which the duty ratio is set to 100%. Hereinafter, the on period and the off period of the pulse generated by the pulse generation unit 4 are referred to as a first period and a second period respectively. Further, the repetition cycle including the first period and the second period is referred to as a control cycle.

The power detection unit 5 includes a directional coupler. The power detection unit 5 detects traveling wave power that is output to the load side by the high-frequency output unit 3 and detects reflected wave power that is reflected from the load side. The power detection unit 5 feeds back a detection result to the control unit 2. The power detection unit 5 may be configured to detect only the traveling wave power.

The matching unit 200 can achieve impedance matching between the high-frequency output unit 3 and the load independently of the high-frequency power supply device 100. However, in a configuration in which the magnitude of the high-frequency power Ps output by the high-frequency output unit 3 is changed in a relatively short cycle, it may be difficult to always perform the impedance matching. Therefore, in Embodiment 1, the matching unit 200 mainly achieves the impedance matching in the first period. Therefore, the matching unit 200 is notified of the timing related to the first period by the control unit 2. It is noted that a signal indicating the first period may be directly given from the pulse generation unit 4 to the matching unit 200.

In the above-mentioned configuration, the high-frequency power Ps is supplied to the load. The control unit 2 can periodically change the magnitude of the high-frequency power Ps to a first level and a second level in the first period and the second period respectively. The control unit 2 sets the cycle and duty ratio of the pulse in the pulse generation unit 4 such that the start time of the first period and the start time of the second period are notified. The duty ratio is the ratio of the first period to the repetition cycle including the first period and the second period, that is, the control cycle. Therefore, for example, the pulse generation unit 4 performs an interrupt to periodically notify the control unit 2 of the start time of the first period and the start time of the second period.

In a case in which the start time of each of the first period and the second period is notified from the pulse generation unit 4, the control unit 2 sets different phase differences in the high-frequency generation unit 1 such that the magnitude of the high-frequency power Ps output from the power combination unit 33 is the first level and the second level. Here, the phase difference corresponding to the first level of the high-frequency power Ps and the phase difference corresponding to the second level of the high-frequency power Ps may be calculated in advance on the basis of Expressions (5) and (7) respectively. In this case, the two calculated values are stored in a storage unit (not illustrated). Further, the phase difference corresponding to each of the first level and the second level may be calculated whenever the setting is performed. The maximum value of the average value Ps_avr of the high-frequency power Ps represented by Expression (5) is ($B^2/R0$). In a case in which the phase difference is calculated whenever the setting is performed, the ratio η of the first level to the maximum value ($B^2/R0$) and the ratio T of the second level to the maximum value ($B^2/R0$) are calculated. The phase differences θ for the two calculated ratios q are calculated separately on the basis of Expression (7). The maximum value of the average value Ps_avr of the high-frequency power Ps may be calculated by actual measurement.

DC-RF conversion units 31 and 32 output the high-frequency powers P1 and P2 respectively. In a case in which the control unit 2 sets the phase difference θ in the high-frequency generation unit 1, the power combination unit 33 combines the high-frequency power P1 and the high-frequency power P2 at the ratio η corresponding to θ. The combined high-frequency power Ps is supplied to the load. The high-frequency power Ps supplied to the load is adjusted so as to be the first level and the second level in the first period and in the second period respectively. However, the actual magnitudes of the high-frequency power P1 and the high-frequency power P2 are affected by a change in the impedance (R0/2) of the load as represented by the above-mentioned Expressions (1) and (2). In addition, the input impedance of the power combination unit 33 and the output impedances of the DC-RF conversion units 31 and 32 are not necessarily matched with each other. Further, the output impedance of the power combination unit 33 and the impedance of the load are not necessarily matched with each other. As a result, the combination ratio q of the power combination unit 33 is different from the value calculated by Expression (6).

Therefore, feedback control may be performed such that the high-frequency powers Ps supplied from the high-frequency output unit 3 to the load in the first period and in the second period respectively approaches the target first level and the target second level respectively. Specifically, the control unit 2 calculates the deviations between the target first level and the detection result of the traveling wave power (or the difference between the traveling wave power and the reflected power), the detection result being fed back from the power detection unit 5 in the first period. The control unit 2 calculates the deviations between the target second level and the detection result of the traveling wave power (or the difference between the traveling wave power and the reflected power), the detection result being fed back from the power detection unit 5 in the second period. The control unit 2 performs control to increase or decrease the phase difference θ set in the high-frequency generation unit 1 such that the calculated deviation approaches zero. Since there are various known methods for specific feedback control, the description of the feedback control will be omitted.

For the above-mentioned feedback control, in the configuration in which the detection results of the traveling wave power are fed back from the power detection unit 5, the phase difference θ is controlled such that the power consumed by the load is less than the target first level and the target second level by the reflected power. Further, in the configuration in which the detection results of the difference between the traveling wave power and the reflected power are fed back from the power detection unit 5, the phase difference θ is controlled such that the powers actually consumed by the load reach the target first level and the target second level. In a configuration in which the response of the feedback control is relatively slow, for example, the phase difference θ may be controlled such that the average value of the detection results fed back from the power detection unit 5 reaches the average value of the target first level and the second level. In this case, the phase difference θ set by the control unit 2 in each of the first period and the second period is collectively determined for each control cycle or for each set of a plurality of control cycles.

As described above, the high-frequency power Ps is supplied from the high-frequency output unit 3 to the load. In a case in which the magnitude of the high-frequency power Ps suddenly changes from the first level to a level significantly different from the first level or in a case in which the magnitude of the high-frequency power Ps suddenly changes from the second level to a level significantly different from the second level, plasma is likely to be unstable. The plasma is also likely to be unstable in a case in which the duty ratio of the first period suddenly changes. For this reason, in Embodiment 1, in a case in which the duty ratio of the first period is changed, the duty ratio is gradually decreased (or gradually increased) and the first level is gradually increased (or gradually decreased). Therefore, a change in the duty ratio of the first period over time and a change in the first level over time are smoothed, and the average value of the high-frequency power Ps supplied from the high-frequency output unit 3 to the load is kept constant. As a result, the plasma is kept stable.

Figure 3:
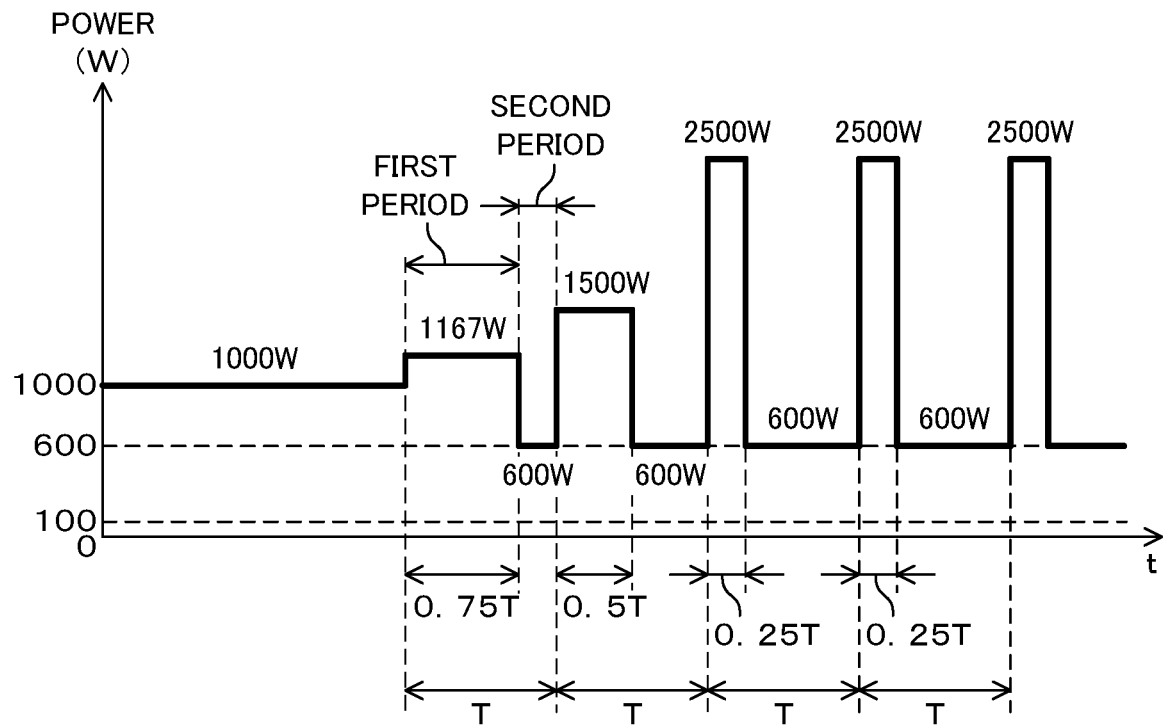
FIG. 3 is an explanatory diagram schematically illustrating high-frequency power in a case in which a first period is gradually decreased in the high-frequency power supply device according to Embodiment 1.
Figure 3:
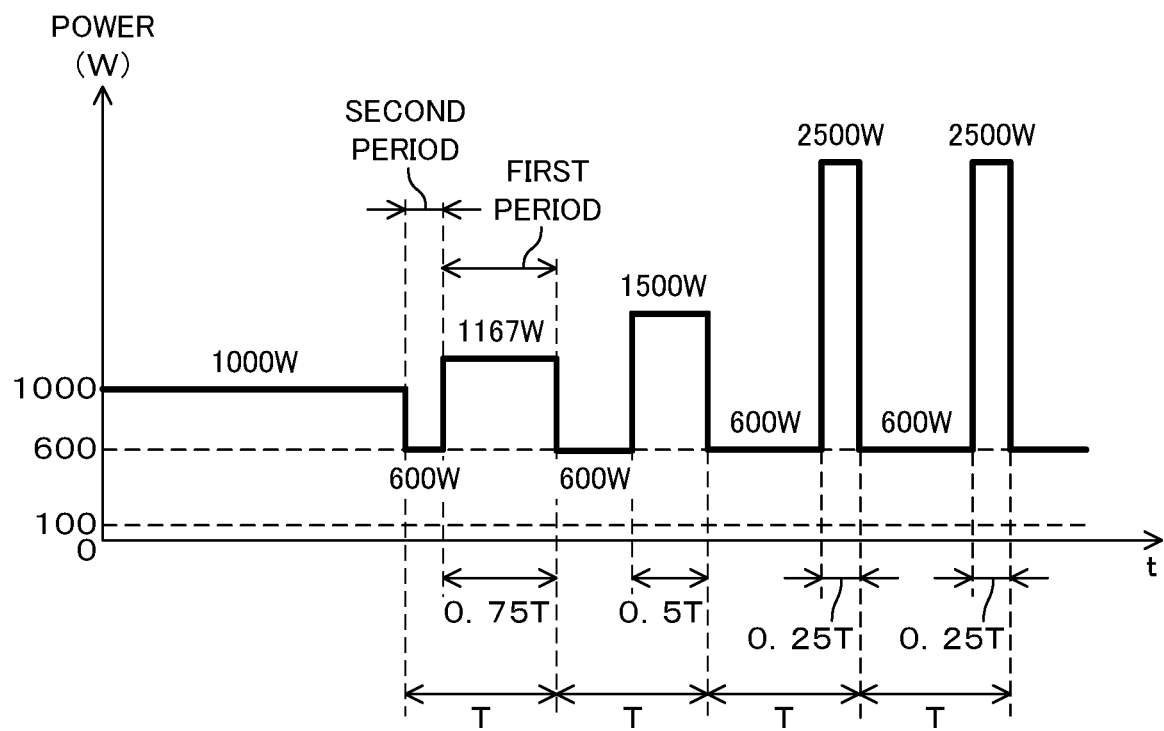

FIG. 3 is an explanatory diagram schematically illustrating the high-frequency power Ps in a case in which the first period is gradually decreased in the high-frequency power supply device 100 according to Embodiment 1. The horizontal axes in two diagrams illustrated in FIG. 3 are the same time axis (t). An upper diagram illustrates a case in which the control cycle including the first period and the second period starts from the first period. A lower diagram illustrates a case in which the control cycle starts from the second period. The control cycle is represented by T. The control unit 2 gradually decreases the duty ratio of the first period in the order of 75%, 50%, and 25% for each control cycle and gradually increases the first level in the order of 1167 W, 1500 W, and 2500 W.

The first period illustrated in the upper diagram and the second period illustrated in the lower diagram correspond to the on period of the pulse generated by the pulse generation unit 4. For example, the control unit 2 gradually decreases the duty ratio set in the pulse generation unit 4. Therefore, the first period in the upper diagram is gradually decreased in synchronization with the timing notified from the pulse generation unit 4. It is noted that a step width in a case in which the duty ratio is gradually decreased is not limited to 25% and may be a smaller value. In addition, after the same duty ratio is continued for a plurality of cycles, the duty ratio may be decreased to a smaller value. The duty ratio may not be linearly decreased. In Embodiment 1, the second level is fixed to 600 W.

The average values of the high-frequency powers Ps in the first control cycle, the second control cycle, and the third control cycle illustrated in the upper diagram are described as Ps1, Ps2, and Ps3 respectively. The average values Ps, Ps2, and Ps3 are represented by the following Expressions (8), (9), and (10) respectively. The unit is W. Decimals are rounded off to the nearest whole number. The value of "100" subtracted in each expression is an estimated value of the reflected power in the second period. It is assumed that impedance matching is achieved in the first period.

$$Ps1 = 1167 \times 0.75 + (600-100) \times 0.25 = 1000 \qquad (8)$$

$$Ps2 = 1500 \times 0.50 + (600-100) \times 0.50 = 1000 \qquad (9)$$

$$Ps3 = 2500 \times 0.25 + (600-100) \times 0.75 = 1000 \qquad (10)$$

The lower diagram is only different from the upper diagram in that each control cycle starts from the second period. In the lower diagram, the average value of the high-frequency power Ps in each control cycle is similar to the average value in the upper diagram. It is noted that, in FIG. 3, the change in the high-frequency power Ps over time in a case in which the duty ratio of the first period is gradually decreased has been described. However, a change in the high-frequency power Ps over time in a case in which the duty ratio of the first period is gradually increased is represented by a diagram obtained by reversing the direction of the time axis in FIG. 3. In this case, the first level is gradually decreased as the duty ratio of the first period is gradually increased.

FIG. 4 is a diagram illustrating the correspondence relationship between the duty ratio and the phase difference used in the high-frequency power supply device 100 according to Embodiment 1. The content of this diagram is stored as a table in the storage unit (not illustrated). In the table, power (W), a phase difference, and an amplitude (relative value) corresponding to a plurality of duty ratios are stored for each of the first level and the second level. In FIG. 3, 100%, 75%, 50%, and 25% are given as an example of the plurality of duty ratios. The power (W), the phase difference, and the amplitude (relative value) corresponding to each duty ratio are illustrated. The power of each of the first level and the second level corresponds to the power illustrated in FIG. 3. The pulse level illustrated in FIG. 4 indicates the relative value of the level of a pulsed voltage signal corresponding to the magnitude of the power and is used in the following Embodiments 2 and 3.

For example, it is assumed that the maximum value of the high-frequency power Ps combined by the power combination unit 33 is 2500 W. In this case, a phase difference θ14 is zero. A phase difference θ13 is calculated on the basis of Expression (6) and is θ that satisfies $1500/2500 = \cos^2(\theta/2)$. Similarly, a phase difference θ12 is θ that satisfies $1167/2500 = \cos^2(\theta/2)$. A phase difference θ11 is θ that satisfies $1000/2500 = \cos^2(\theta/2)$. Phase differences θ22 to θ24 are θ that satisfies $600/2500 = \cos^2(\theta/2)$. In a case in which the duty ratio is 100%, both of the first level and the second level (two levels) do not exist. However, for convenience, the phase difference and the amplitude are stored assuming that the first level and the second level are 1000 W. Hereinafter, a method for controlling the phase difference θ with reference to the table corresponding to the diagram illustrated in FIG. 4 will be described using a flowchart.

Figure 5:
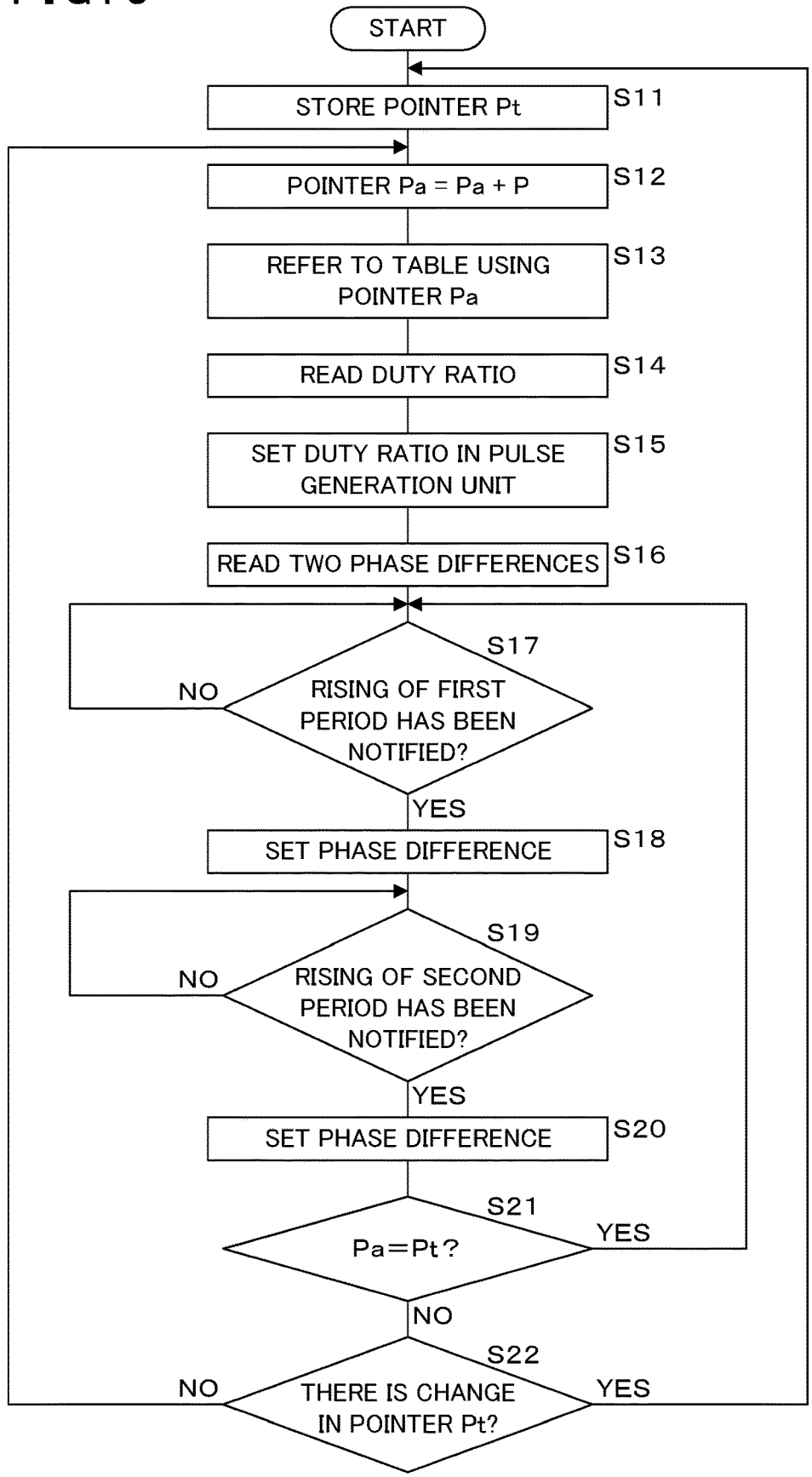
FIG. 5 is a flowchart illustrating a processing procedure of a control unit that sets the duty ratio and the phase difference in a pulse generation unit and a high-frequency generation unit respectively.

FIG. 5 is a flowchart illustrating the processing procedure of the control unit 2 setting the duty ratio and the phase difference in the pulse generation unit 4 and the high-frequency generation unit 1 respectively. Each of Pa and Pt in FIG. 5 is a pointer indicating the head address of a region in which the content of each column of the diagram illustrated in FIG. 4 is stored. Hereinafter, this pointer is simply referred to as a column pointer. In a case in which the content of each column is regarded as an array, Pa and Pt are pointers indicating the address of the array. Pa indicates the head address of a column that is currently referred to. Pt indicates the head address of the final target column. ΔP is a difference indicating the distance between the head addresses of two columns. The control unit 2 stores the pointer Pa of the current column and the pointer Pt of the target column.

In a case in which the duty ratio of the first period is gradually decreased as illustrated in FIG. 3, the control unit 2 sets the pointer of the column corresponding to a final target duty ratio of 25% to Pt and sets the distance (positive value) between adjacent columns to ΔP. Then, the control unit 2 starts the process illustrated in FIG. 5. The initial value of Pa is the pointer of the column corresponding to a duty ratio of 100%. In a case in which the duty ratio of the first period is gradually increased, when setting the pointer of the column corresponding to a new target duty ratio to Pt, the control unit 2 sets a value (negative value) obtained by reversing the sign of the distance between adjacent columns to ΔP.

In a case in which the process illustrated in FIG. 5 is started, the control unit 2 temporarily stores the pointer Pt of the column corresponding to the target duty ratio in the storage unit (not illustrated) (S11). Then, the control unit 2 adds ΔP to the pointer Pa of the current column (S12). Here, in a case in which ΔP is a positive value, the column indicated by Pa is changed to an adjacent column in which the duty ratio is small by one step. In a case in which ΔP is a negative value, the column indicated by Pa is changed to an adjacent column in which the duty ratio is large by one step.

Then, the control unit 2 refers to the table corresponding to the diagram illustrated in FIG. 4 using the pointer Pa (S13) and reads the duty ratio from the content of the column indicated by Pa (S14). The control unit 2 sets the read duty ratio in the pulse generation unit 4 (S15). The set duty ratio is reflected in the next control cycle following the current control cycle. The control cycle is set in the pulse generation unit 4 in an initialization process. Then, the control unit 2 reads the phase differences corresponding to the first level and the second level respectively from the content of the column indicated by Pa (S16).

Then, the control unit 2 determines whether or not the rising of the first period has been notified from the pulse generation unit 4 (S17). In a case in which the rising of the first period has not been notified (S17: NO), the control unit 2 waits until the rising is notified. In a case in which the rising of the first period has been notified (S17: YES), the control unit 2 sets, in the high-frequency generation unit 1, a phase difference corresponding to the first level among the phase differences read in advance in Step S16 (S18).

Then, the control unit 2 determines whether or not the rising of the second period has been notified from the pulse generation unit 4 (S19). In a case in which the rising of the second period has not been notified (S19: NO), the control unit 2 waits until the rising of the second period is notified. In a case in which the rising of the second period has been notified (S19: YES), the control unit 2 sets, in the high-frequency generation unit 1, a phase difference corresponding to the second level among the phase differences read in advance in Step S16 (S20).

Then, the control unit 2 determines whether or not the pointer Pa of the present column is identical to the pointer Pt of the target column (S21). In a case in which the pointer Pa is identical to the pointer Pt (S21: YES), the control unit 2 moves the process to Step S17 in order to periodically set the phase difference corresponding to each of the subsequent first level and the subsequent second level. In a case in which the pointer Pa is not identical to the pointer Pt (S21: NO), the control unit 2 determines whether or not there is a change in the pointer Pt used in Step S21 (S22).

No change in the pointer Pt indicates that the gradual decrease or increase in the duty ratio of the first period has not been completed. In a case in which there is no change in the pointer Pt (S22: NO), the control unit 2 moves the process to Step S12 in order to advance the pointer Pa of the current column by one. The change in the pointer Pt indicates that the pointer of the target column has been changed. In a case in which there is a change in the pointer Pt (S22: YES), the control unit 2 moves the process to Step S11 in order to start the sequence of gradually decreasing or increasing the duty ratio of the first period from the beginning.

The above-mentioned processing procedure of the control unit 2 illustrated in FIG. 5 corresponds to the case in which the first period starts before the second period as illustrated in the upper part of FIG. 3. For the processing procedure of the control unit 2 in a case in which the second period starts before the first period as illustrated in the lower part of FIG. 3, the table corresponding to the diagram illustrated in FIG. 4 and a portion of the processing procedure illustrated in FIG. 5 may be changed. Specifically, first, the duty ratio stored in each column of the table is changed from the duty ratio of the first period to the duty ratio of the second period.

As such, since the duty ratio of the second period is set in the pulse generation unit 4 in Step S15 illustrated in FIG. 5, the start time of the second period in one control cycle is notified first. Therefore, the control unit 2 may perform Steps S17 to S20 as follows. In Step S17 illustrated in FIG. 5, the control unit 2 waits for the rising of the second period. In Step S18, the control unit 2 sets the phase difference corresponding to the second level in the high-frequency generation unit 1. In Step S19, the control unit 2 waits for the rising of the first period. In Step S20, the control unit 2 sets the phase difference corresponding to the first level in the high-frequency generation unit 1.

In Embodiment 1, the control unit 2 periodically controls the phases of the high-frequency signals S1 and S2 which are generated by the high-frequency generation unit 1. The high-frequency output unit 3 outputs the high-frequency power Ps on the basis of the high-frequency signals S1 and S2, phases of which have been controlled. The control unit 2 controls the phases of the high-frequency signals S1 and S2 to periodically adjust the magnitude of the high-frequency power Ps output by the high-frequency output unit 3 to the first level and the second level in the first period and the second period respectively. The second level is lower than the first level. In addition, the control unit 2 gradually decreases the duty ratio of the first period to the control cycle and gradually increases the first level, while periodically controlling the phases. Therefore, the average value of the high-frequency power Ps output by the high-frequency output unit 3 is kept constant. As a result, it is possible to mitigate a sudden change in the high-frequency power Ps.

Further, in Embodiment 1, the high-frequency generation unit 1 generates the high-frequency signals S1 and S2 which have the same frequency. The control unit 2 separately controls the phase difference θ between the high-frequency signal S1 and the high-frequency signal S2 in each of the first period and the second period. The DC-RF conversion units 31 and 32 are included in the high-frequency output unit 3. The DC-RF conversion unit 31 generates the high-frequency voltage V1 having a phase corresponding to the high-frequency signal S1. The DC-RF conversion unit 32 generates the high-frequency voltage V2 having a phase corresponding to the high-frequency signal S2. The high-frequency output unit 3 combines the high-frequency power P1 and the high-frequency power P2 which are based on the generated high-frequency voltages V1 and V2 respectively, at a ratio corresponding to the phase difference θ between the high-frequency voltage V1 and the high-frequency voltage V2. The high-frequency output unit 3 outputs the combined high-frequency power Ps. The high-frequency power P1 and the high-frequency power P2 are based on the high-frequency voltage V1 and the high-frequency voltage V2 respectively. In the first period and in the second period, the high-frequency power P1 and the high-frequency power P2 are combined at different ratios. Therefore, it is possible to change the magnitudes of the high-frequency powers Ps output in the first period and in the second period respectively to the first level and the second level respectively.

Furthermore, in Embodiment 1, for the high-frequency power Ps output by the high-frequency output unit 3 in the first period, the control unit 2 controls the above-mentioned phase such that the magnitude detected by the power detection unit 5 is identical to the first level. Here, the first level is a target value of the high-frequency power Ps to be output by the high-frequency output unit 3 in the first period of the present control cycle. For the high-frequency power Ps output by the high-frequency output unit 3 in the second period, the control unit 2 controls the above-mentioned phase such that the magnitude detected by the power detection unit 5 is identical to the second level. Here, the second level is a target value of the high-frequency power Ps to be output by the high-frequency output unit 3 in the second period of the present control cycle. Since the control unit 2 controls the phase as described above, it is possible to accurately adjust the magnitude of the high-frequency power Ps output by the high-frequency output unit 3 in each control cycle.

Modification Example 1

Embodiment 1 is an aspect in which the duty ratio of the first period is gradually decreased (or gradually increased) and the first level is gradually increased (or gradually decreased). Modification Example 1 is an aspect in which both the second level and the duty ratio of the first period are gradually decreased (or gradually increased) and the first level is gradually increased (or gradually decreased). The block configuration of a high-frequency power supply device according to Modification Example 1 is similar to the block configuration of the high-frequency power supply device 100 illustrated in FIG. 1 in Embodiment 1. Therefore, in Modification Example 1, portions corresponding to those in Embodiment 1 are denoted by the same reference numerals and the description of the configuration thereof will be omitted.

Figure 6:
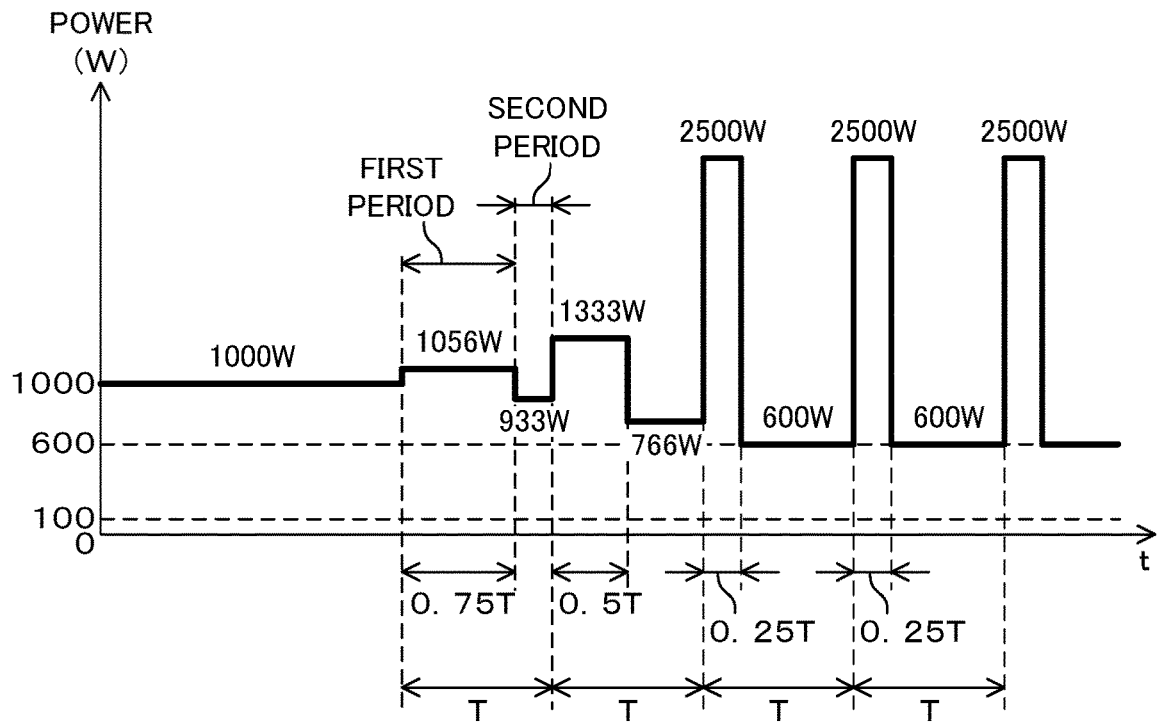
FIG. 6 is an explanatory diagram schematically illustrating high-frequency power in a case in which a first period is gradually decreased in a high-frequency power supply device according to Modification Example 1.
Figure 6:
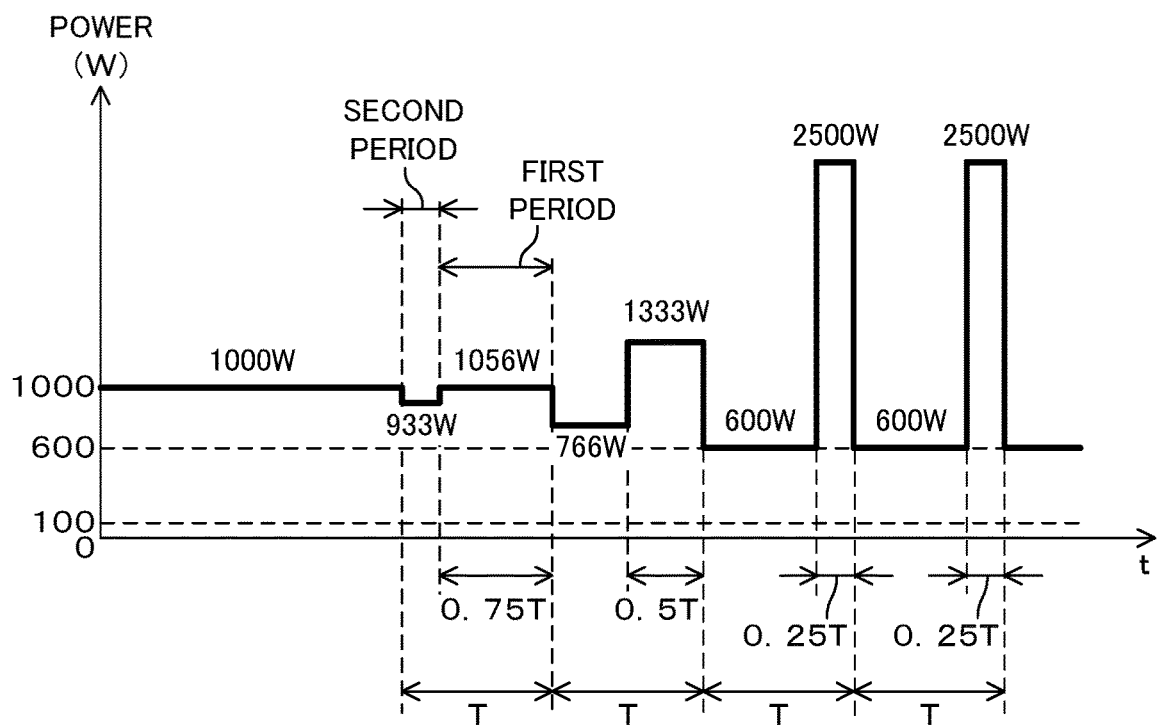

FIG. 6 is an explanatory diagram schematically illustrating the high-frequency power Ps in a case in which the duty ratio of the first period is gradually decreased in a high-frequency power supply device 100 according to Modification Example 1. The horizontal axes of two diagrams illustrated in FIG. 6 are the same time axis (t). An upper diagram illustrates a case in which the control cycle including the first period and the second period starts from the first period. A lower diagram illustrates a case in which the control cycle starts from the second period. The duty ratio of the first period is gradually decreased in the order of 75%, 50%, and 25% for each control cycle. With the gradual decrease of the duty ratio, the first level is gradually increased in the order of 1056 W, 1333 W, and 2500 W and the second level is gradually decreased in the order of 933 W, 766 W, and 600 W.

The average values of the high-frequency powers Ps in the first control cycle, the second control cycle, and the third control cycle illustrated in the upper diagram are described as Ps1, Ps2, and Ps3 respectively. For example, the average values Ps1, Ps2, and Ps3 are represented by the following Expressions (11), (12), and (13) respectively. The unit is W. Decimals are rounded off to the nearest whole number.

$$Ps1 = 1056 \times 0.75 + (933-100) \times 0.25 = 1000 \quad (11)$$

$$Ps2 = 1333 \times 0.50 + (766-100) \times 0.50 = 1000 \quad (12)$$

$$Ps3 = 2500 \times 0.25 + (600-100) \times 0.75 = 1000 \quad (13)$$

The lower diagram is only different from the upper diagram in that each control cycle starts from the second period. In the lower diagram, the average value of the high-frequency power Ps in each control cycle is similar to that in the upper diagram. It is noted that the change in the high-frequency power Ps over time in a case in which the duty ratio of the first period is gradually decreased has been described in FIG. 6. A change in the high-frequency power Ps over time in a case in which the duty ratio of the first period is gradually increased is represented by a diagram obtained by reversing the direction of the time axis in FIG. 6. In this case, the duty ratio of the first period is gradually increased. With the gradual increase of the duty ratio, the first level is gradually decreased and the second level is gradually increased.

FIG. 7 is a diagram illustrating the correspondence relationship between the duty ratio and the phase difference used in the high-frequency power supply device 100 according to Modification Example 1. The content of this diagram is stored as a table. In the table, power (W), a phase difference, and an amplitude (relative value) corresponding to a plurality of duty ratios are stored for each of the first level and the second level. In FIG. 7, 100%, 75%, 50%, and 25% are given as an example of the plurality of duty ratios. The power (W), the phase difference, and the amplitude (relative value) corresponding to the each duty ratio are illustrated. The power of each of the first level and the second level corresponds to the power illustrated in FIG. 6.

For example, it is assumed that the maximum value of the high-frequency power Ps combined by the power combination unit 33 is 2500 W. In this case, a phase difference θ34 is zero. A phase difference θ33 is calculated on the basis of Expression (6) and is θ that satisfies $1333/2500 = \cos^2(\theta/2)$. Similarly, a phase difference θ32 is θ that satisfies $1056/2500 = \cos^2(\theta/2)$. A phase difference θ31 is θ that satisfies $1000/2500 = \cos^2(\theta/2)$. A phase difference θ44 is θ that satisfies $600/2500 = \cos^2(\theta/2)$. A phase difference θ43 is θ that satisfies $766/2500 = \cos^2(\theta/2)$. A phase difference θ42 is θ that satisfies $933/2500 = \cos^2(\theta/2)$.

A flowchart illustrating the processing procedure of the control unit 2 periodically setting the phase difference in the high-frequency generation unit 1 is the same as the flowchart in Embodiment 1. Therefore, the illustration and description of the flowchart according to Modification Example 1 will be omitted.

As described above, in Modification Example 1, the control unit 2 periodically controls the phases of the high-frequency signals S1 and S2 which are generated by the high-frequency generation unit 1. The control unit 2 gradually decreases the duty ratio of the first period to the control cycle while controlling the phases. With the gradual decrease of the duty ratio, the control unit 2 gradually increases the first level and gradually decreases the second level. Therefore, the average value of the high-frequency power Ps output by the high-frequency output unit 3 is kept constant. As a result, it is possible to mitigate a sudden change in the high-frequency power Ps.

Modification Example 2

Embodiment 1 is the aspect in which the duty ratio of the first period is gradually decreased (or gradually increased) and the first level is gradually increased (or gradually decreased). Modification Example 2 is an aspect in which the second level is gradually decreased (or gradually increased) and the first level is gradually increased (or gradually decreased). The block configuration of a high-frequency power supply device according to Modification Example 2 is similar to the block configuration of the high-frequency power supply device 100 illustrated in FIG. 1 in Embodiment 1. Therefore, in Modification Example 2, portions corresponding to those in Embodiment 1 are denoted by the same reference numerals and the description of the configuration thereof will be omitted.

Figure 8:
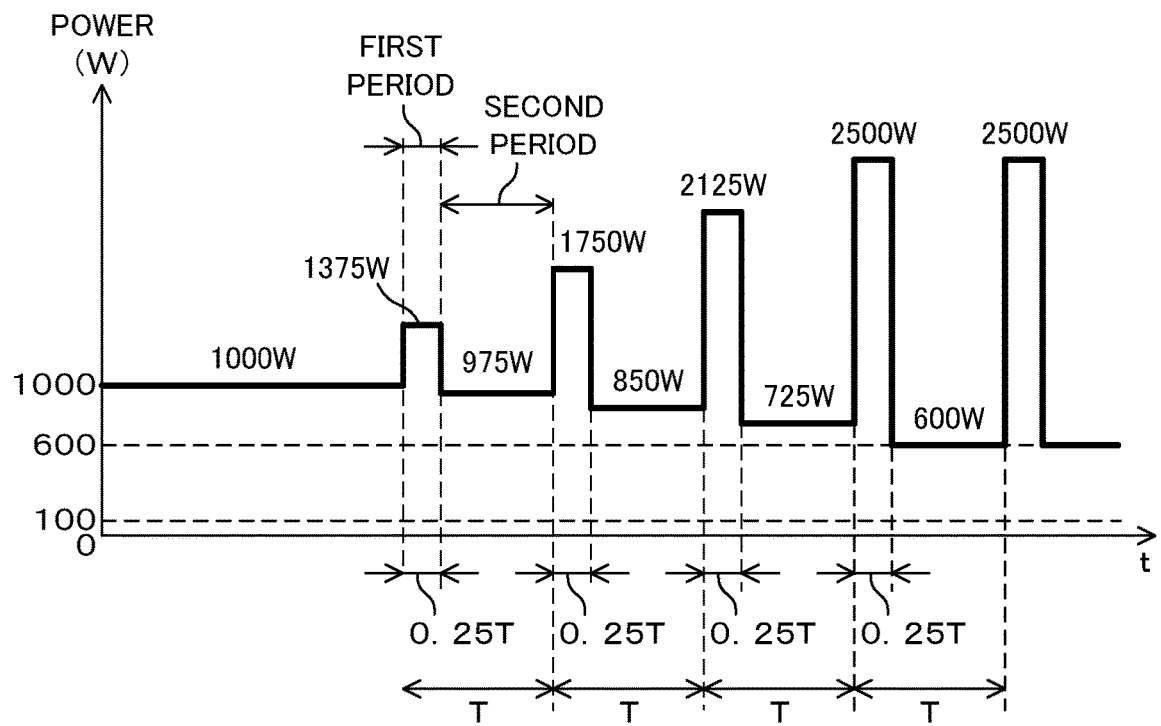
FIG. 8 is an explanatory diagram schematically illustrating high-frequency power in a case in which a second period is gradually decreased in a high-frequency power supply device according to Modification Example 2.
Figure 8:
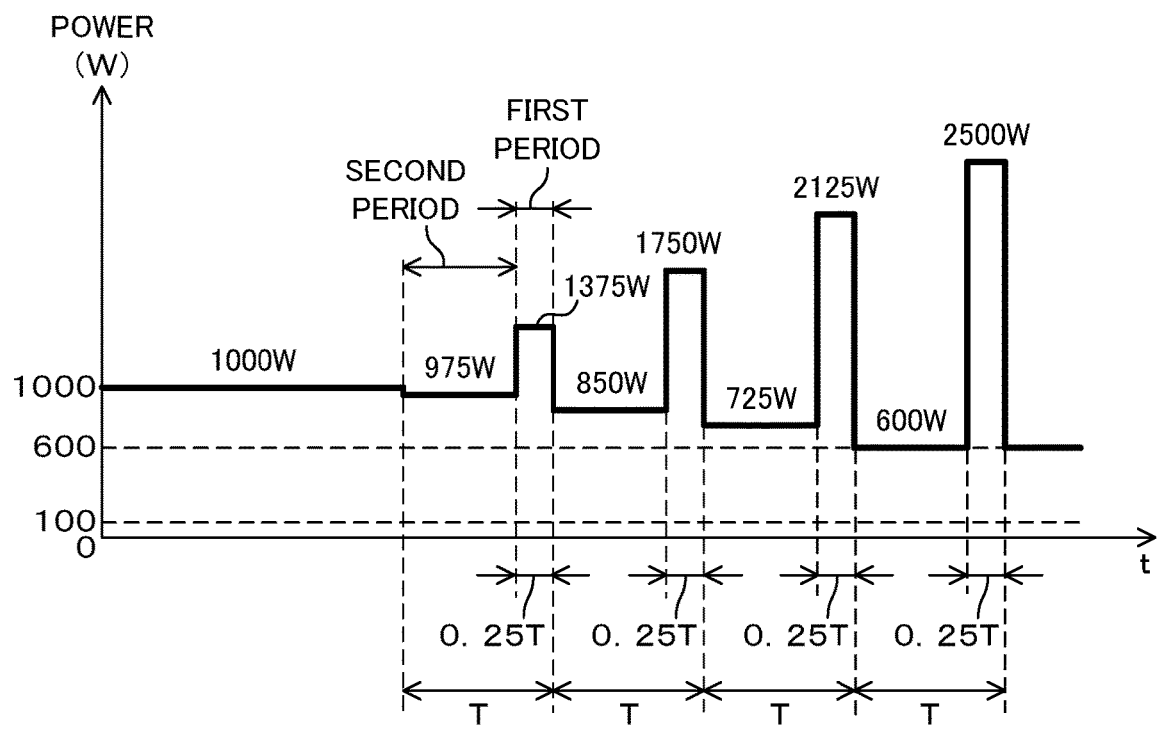

FIG. 8 is an explanatory diagram schematically illustrating the high-frequency power Ps in a case in which the second level is gradually decreased in a high-frequency power supply device 100 according to Modification Example 2. The horizontal axes of two diagrams illustrated in FIG. 8 are the same time axis (t). An upper diagram illustrates a case in which the control cycle including the first period and the second period starts from the first period. A lower diagram illustrates a case in which the control cycle starts from the second period. In a state in which the duty ratio of the first period is fixed to 25%, the first level is gradually increased in the order of 1375 W, 1750 W, 2125 W, and 2500 W and the second level is gradually decreased in the order of 975 W, 850 W, 725 W, and 600 W.

The average values of the high-frequency powers Ps in the first control cycle, the second control cycle, and the third control cycle illustrated in the upper diagram are described as Ps1, Ps2, and Ps3 respectively. For example, the average values Ps1, Ps2, and Ps3 are represented by the following Expressions (14), (15), and (16) respectively. The unit is W.

$$Ps1=1375\times0.25+(975-100)\times0.75=1000 \quad (14)$$

$$Ps2=1750\times0.25+(850-100)\times0.75=1000 \quad (15)$$

$$Ps3=2500\times0.25+(600-100)\times0.75=1000 \quad (16)$$

The lower diagram is only different from the upper diagram in that each control cycle starts from the second period. In the lower diagram, the average value of the high-frequency power Ps in each control cycle is similar to that in the upper diagram. It is noted that the change in the high-frequency power Ps over time in a case in which the second level is gradually decreased has been described in FIG. 8. A change in the high-frequency power Ps over time in a case in which the second level is gradually increased is represented by a diagram obtained by reversing the direction of the time axis in FIG. 8. In this case, in a state in which the duty ratio of the first period is fixed to a constant value, the first level is gradually decreased and the second level is gradually increased.

FIG. 9 is a diagram illustrating the correspondence relationship between the duty ratio and the phase difference used in the high-frequency power supply device 100 according to Modification Example 2. The content of this diagram is stored as a table. In the table, power (W), a phase difference, and an amplitude (relative value) in a case in which the duty ratio is uniformly 25% are stored for each of the first level and the second level. The power of each of the first level and the second level corresponds to the power illustrated in FIG. 8.

For example, it is assumed that the maximum value of the high-frequency power Ps combined by the power combination unit 33 is 2500 W. In this case, a phase difference θ55 is zero. A phase difference θ54 is calculated on the basis of Expression (6) and is θ that satisfies $2125/2500=\cos^2(\theta/2)$. Similarly, a phase difference θ53 is θ that satisfies $1750/2500=\cos^2(\theta/2)$. A phase difference θ52 is θ that satisfies $1375/2500=\cos^2(\theta/2)$. A phase difference θ51 is θ that satisfies $1000/2500=\cos^2(\theta/2)$. A phase difference θ65 is θ that satisfies $600/2500=\cos^2(\theta/2)$. A phase difference θ64 is θ that satisfies $725/2500=\cos^2(\theta/2)$. A phase difference θ63 is θ that satisfies $850/2500=\cos^2(\theta/2)$. A phase difference θ62 is θ that satisfies $975/2500=\cos^2(\theta/2)$.

A flowchart illustrating the processing procedure of the control unit 2 periodically setting the phase difference in the high-frequency generation unit 1 is the same as the flowchart in Embodiment 1. Therefore, the illustration and description of the flowchart according to Modification Example 2 will be omitted.

As described above, in Modification Example 2, the control unit 2 periodically controls the phases of the high-frequency signals S1 and S2 which are generated by the high-frequency generation unit 1. The control unit 2 gradually increases the first level and gradually decreases the second level while controlling the phases. Therefore, the average value of the high-frequency power Ps output by the high-frequency output unit 3 is kept constant. As a result, it is possible to mitigate a sudden change in the high-frequency power Ps.

Embodiment 2

In Embodiment 1, the control unit 2 periodically controls the phases of the high-frequency signals S1 and S2 which are generated by the high-frequency generation unit 1. The high-frequency output unit 3 outputs the high-frequency power Ps on the basis of the high-frequency signals S1 and S2, phases of which have been controlled. The magnitudes of the high-frequency powers Ps output by the high-frequency output unit 3 are periodically adjusted to the first level and the second level. In Embodiment 2, the control unit 2 periodically controls the amplitude of the high-frequency signal generated by the high-frequency generation unit. The high-frequency output unit outputs high-frequency power on the basis of the high-frequency signal, amplitude of which has been controlled. The magnitudes of the high-frequency powers output by the high-frequency output unit are periodically adjusted to the first level and the second level.

Figure 10:
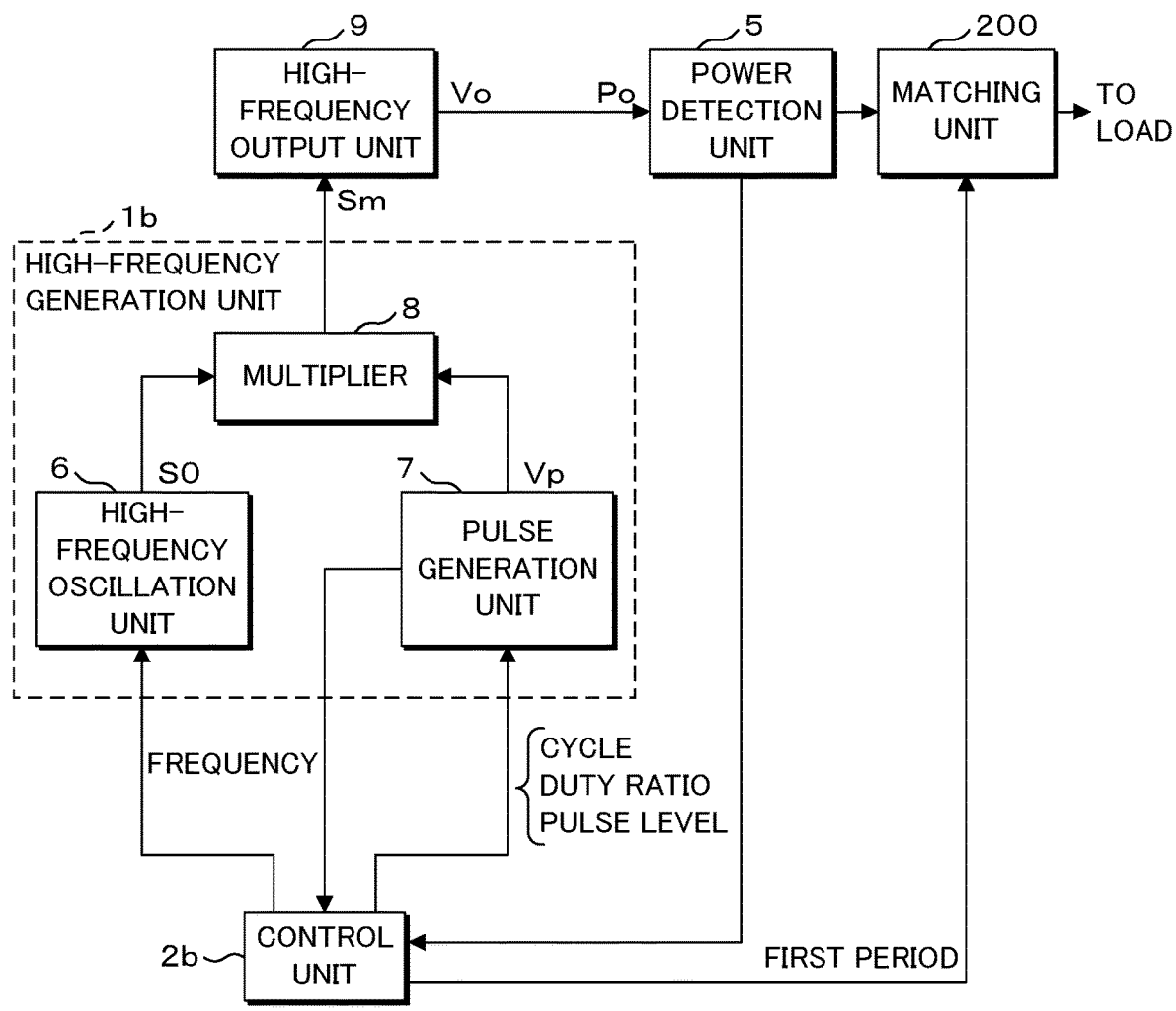
FIG. 10 is a block diagram illustrating an example of the configuration of a high-frequency power supply device according to Embodiment 2.

FIG. 10 is a block diagram illustrating an example of the configuration of a high-frequency power supply device 100b according to Embodiment 2. The high-frequency power supply device 100b includes a high-frequency generation unit 1b, a control unit 2b, and a high-frequency output unit 9. The high-frequency generation unit 1b generates a high-frequency signal Sm. The control unit 2b controls the amplitude of the high-frequency signal Sm generated by the high-frequency generation unit 1b. The high-frequency output unit 9 outputs high-frequency power Po having a magnitude corresponding to the high-frequency signal Sm, amplitude of which has been controlled. The high-frequency power supply device 100b further includes a power detection unit 5 that detects the high-frequency power Po output by the high-frequency output unit 9. The high-frequency power Po output by the high-frequency output unit 9 is supplied to a load through the power detection unit 5 and a matching unit 200. The matching unit 200 achieves impedance matching with the power detection unit 5 and the load. In Embodiment 2, portions corresponding to those in Embodiment 1 are denoted by the same reference numerals and the description of the configuration thereof will be omitted.

The high-frequency generation unit 1b includes a high-frequency oscillation unit 6, a pulse generation unit 7, and a multiplier 8. The high-frequency oscillation unit 6 oscillates a high-frequency continuous signal S0. The pulse generation unit 7 generates a rectangular wave pulse signal Vp for modulating the continuous signal S0 oscillated by the high-frequency oscillation unit 6. The multiplier 8 multiplies the continuous signal S0 oscillated by the high-frequency oscillation unit 6 and the pulse signal Vp generated by the pulse generation unit 7, to modulate the amplitude of the continuous signal S0. The rectangular wave signal is a signal having stepwise rising and falling edges. In the rectangular wave signal, the level before the rising edge and the level after the falling edge are not necessarily zero levels. Here, the rectangular wave signal is also regarded as a pulse signal in a broad sense. For the rectangular wave signal, an on period is a period from the rising edge to the falling edge.

The control unit 2b includes a CPU, a ROM, and a RAM and has the similar hardware configuration as the control unit 2 illustrated in FIG. 1 in Embodiment 1. In a software configuration, the control unit 2 periodically sets the duty ratio in the pulse generation unit 4 and periodically sets the phase difference θ in the high-frequency generation unit 1. The control unit 2b periodically sets the duty ratio and two pulse levels in the pulse generation unit 7. This will be described in detail below.

The high-frequency oscillation unit 6 is configured by, for example, a direct digital synthesizer. The voltage of the high-frequency continuous signal S0 oscillated by the high-frequency oscillation unit 6 is represented by v(t)=A0 sin (2πft+φ). The high-frequency oscillation unit 6 inputs the high-frequency continuous signal S0 to one multiplication input of the multiplier 8. A0 is a constant amplitude. φ is an initial phase. f is a frequency set by the control unit 2b and is, for example, a frequency of 2 MHz, 13.56 MHz, 27 MHz, or 60 MHz in the industrial RF band.

The pulse generation unit 7 is configured by for example, a direct digital synthesizer. The pulse generation unit 7 generates the pulse signal Vp having a high level and a low level according to the cycle, the duty ratio, and the two pulse levels which are set by the control unit 2b. The pulse generation unit 7 inputs the generated pulse signal Vp to the other multiplication input of the multiplier 8. The cycle of the pulse signal Vp is sufficiently longer than the cycle represented by the reciprocal of the frequency f set in the high-frequency oscillation unit 6 by the control unit 2b. The pulse generation unit 7 periodically notifies the control unit 2b of the start time of a period in which the pulse signal Vp is at the high level and the start time of a period in which the pulse signal Vp is at the low level.

For convenience, even in a case in which the duty ratio is set to 100% in the pulse generation unit 7, the two start times are notified to the control unit 2b. As described above, the pulse generation unit 7 generates the pulse signal Vp. Hereinafter, the period in which the pulse signal Vp is at the high level is referred to as a first period. The period in which the pulse signal Vp is at low level is referred to as a second period. Further, the repetition cycle including the first period and the second period is referred to as a control cycle.

The multiplier 8 is configured by, for example, an analog multiplier or a digital modulator. For the multiplier 8, an instantaneous value of the high-frequency continuous signal S0 and an instantaneous value of the pulse signal Vp are input to the two multiplication inputs. The multiplier 8 performs a process of multiplying the instantaneous value of the high-frequency continuous signal S0 by the instantaneous value of the pulse signal Vp. Therefore, amplitude shift keying is performed on the high-frequency continuous signal S0. The multiplier 8 outputs the high-frequency signal Sm obtained by performing the amplitude shift keying. In a case in which the level of the pulse signal Vp is a constant reference level Lr and the duty ratio is 100%, the high-frequency signal Sm output by the multiplier 8 is represented by the following Expression (17) using a voltage formula representing the continuous signal S0.

$$Sm = Lr \cdot B0 \, \sin(2\pi ft + \phi) \tag{17}$$

where B0: a constant amplitude

The high-frequency output unit 9 is configured by a linear amplifier. The high-frequency output unit 9 linearly amplifies the high-frequency signal Sm input from the multiplier 8, that is, the high-frequency generation unit 1b. The high-frequency output unit 9 outputs a high-frequency voltage Vo obtained by the amplification.

Therefore, the high-frequency power Po having a magnitude corresponding to the high-frequency voltage Vo is supplied to the load side. It is assumed that the impedance of a case in which the load side is viewed from the high-frequency output unit 9 is R0/2 similarly as in Embodiment 1. In a case in which the level of the pulse signal Vp is the constant reference level Lr, the high-frequency power Po output by the high-frequency output unit 9 is represented by the following Expression (18) using Expression (17). In this case, the average value Po_avr of the high-frequency power Po is represented by the following Expression (19) and is proportional to the square of the reference level Lr.

$$Po = (G \cdot Lr \cdot B0)^2 \sin^2(2\pi ft + \phi)/(R0/2) \tag{18}$$

$$Po\_avr = (G \cdot Lr \cdot B0)^2/R0 \tag{19}$$

where G: an amplification factor of the high-frequency output unit

The above-described configuration makes it possible for the control unit 2b to periodically change the magnitudes of the high-frequency powers Po supplied to the load, to the first level and the second level in the first period and the second period respectively. The control unit 2b sets the cycle and the duty ratio of the pulse signal Vp in the pulse generation unit 7 such that the start times of the first period and the second period are notified. The duty ratio is the ratio of the first period to the repetition period including the first period and the second cycle, that is, the control cycle. Therefore, the pulse generation unit 7 performs, for example, an interrupt to periodically notify the control unit 2b of the start time of the first period and the start time of the second period.

In a case in which the start time of each of the first period and the second period is notified from the pulse generation unit 7, the control unit 2b sets different pulse levels in the pulse generation unit 7 such that the magnitudes of the high-frequency powers Po output from the high-frequency output unit 9 are the first level and the second level respectively. The pulse levels set in the pulse generation unit 7 at the start times of the first period and the second period are reflected in signal levels in the on period and the off period of the pulse signal Vp generated by the pulse generation unit 7. Then, the magnitudes of the high-frequency powers Po are adjusted to the first level and the second level respectively on the basis of the signal levels.

Here, a pulse level corresponding to the first level and a pulse level corresponding to the second level may be calculated in advance on the basis of Expression (19). In this case, the two calculated values are stored in the storage unit (not illustrated). Further, the pulse levels corresponding to the first level and the second level may be calculated whenever the setting is performed. As described above, the average value Po_avr of the high-frequency power Po is represented by Expression (19). Specifically, a multiplying factor of the first level with respect to the average value Po_avr and a multiplying factor of the second level with respect to the average value Po_avr are calculated. The square root of each of the two calculated multiplying factors is multiplied by the reference level Lr to calculate a high pulse level and a low pulse level. The average value Po_avr of the high-frequency power Po in a case in which the level of the pulse signal Vp is the constant reference level Lr may be calculated by actual measurement.

It is possible to perform feedback control such that the high-frequency powers Po supplied from the high-frequency output unit 9 to the load in the first period and in the second period respectively, approaches the target first level and the target second level respectively. This is the similar to that in Embodiment 1. In a case in which the first level or the second level is changed, the duty ratio of the first period is gradually decreased (or gradually increased) with the change in the first level or the second level, to keep the plasma stable. This configuration is also similar to those in Embodiment 1, Modification Example 1, and Modification Example 2.

For example, in a case in which the duty ratio of the first period is gradually decreased (or gradually increased) and the first level is gradually increased (or gradually decreased), the pulse level set in the pulse generation unit 7 is changed according to the change in the duty ratio. For example, the diagram illustrated in FIG. 4 in Embodiment 1 is used in order to change the pulse level. In a case in which the pulse level is changed as described above, the first period corresponds to the on period of the rectangular wave pulse signal Vp generated by the pulse generation unit 7. For example, the control unit 2 gradually decreases the duty ratio set in the pulse generation unit 7. Therefore, it is possible to gradually decrease the first period in synchronization with the timing notified from the pulse generation unit 7.

Similarly, in a case in which both the duty ratio of the first period and the second level are gradually decreased (or gradually increased) and the first level is gradually increased (or gradually decreased), the pulse level set in the pulse generation unit 7 is changed according to the change in the duty ratio. For example, the diagram illustrated in FIG. 7 in Modification Example 1 is used in order to change the pulse level. In addition, it is assumed that the second level is gradually decreased (or gradually increased) and the first level is gradually increased (or gradually decreased). In this case, the pulse level set in the pulse generation unit 7 is gradually decreased (or gradually increased) toward the target second level and the pulse level set in the pulse generation unit 7 is gradually increased (or gradually decreased) toward the target first level. For example, the diagram illustrated in FIG. 9 in Modification Example 2 is used in order to gradually decrease or increase the pulse level.

In FIGS. 4, 7, and 9, the pulse level of a case in which the first level is 1000 W is set as the reference level Lr. The square root of the multiplying factor of each of the first level and the second level with respect to 1000 W is set as a pulse level relative to the reference level Lr. Hereinafter, a method for controlling a pulse level will be described using flowcharts with reference to the tables corresponding to the diagrams illustrated in FIGS. 4, 7, and 9.

Figure 11:
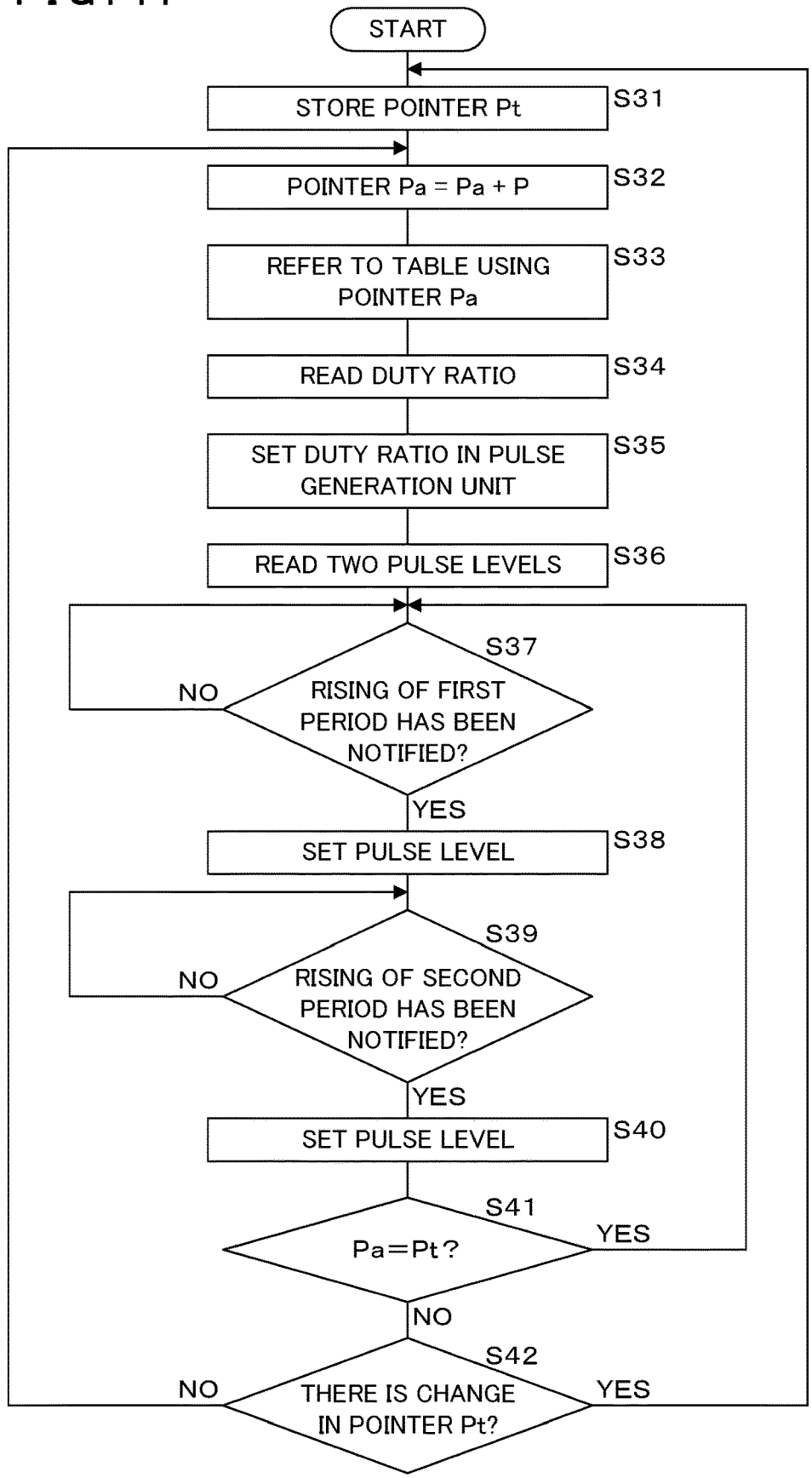
FIG. 11 is a flowchart illustrating a processing procedure of a control unit that sets a duty ratio and a pulse level in a pulse generation unit.

FIG. 11 is a flowchart illustrating the processing procedure of the control unit 2b that sets the duty ratio and the pulse level in the pulse generation unit 7. Steps S31 to S42 except Steps S36, S38, and S40 in FIG. 11 correspond to Steps S11 to S22 illustrated in FIG. 5 in Embodiment 1. The content of the processes of Steps S31 to S42 except Steps S36, S38, and S40 is similar to that in Embodiment 1. Therefore, Steps S36, S38, and S40 will be mainly described.

In a case in which the process illustrated in FIG. 11 is started and the process from Steps S31 to S35 is ended, the control unit 2b reads pulse levels corresponding to the first level and the second level from the content of the column indicated by Pa (S36). Then, the control unit 2b determines whether or not the rising of the first period has been notified from the pulse generation unit 7 (S37). In a case in which the rising of the first period has not been notified (S37: NO), the control unit 2b waits until the rising is notified. In a case in which the rising of the first period has been notified (S37: YES), the control unit 2b sets, in the pulse generation unit 7, a pulse level corresponding to the first level among the pulse levels read in advance in Step S36 (S38).

Then, the control unit 2b determines whether or not the rising of the second period has been notified from the pulse generation unit 7 (S39). In a case in which the rising of the second period has not been notified (S39: NO), the control unit 2b waits until the rising is notified. In a case in which the rising of the second period has been notified (S39: YES), the control unit 2b sets, in the pulse generation unit 7, a pulse level corresponding to the second level among the pulse levels read in advance in Step S36 (S40). The subsequent process is similar to that in Embodiment 1.

As described above, in Embodiment 2, the control unit 2b periodically controls the amplitude of the high-frequency signal Sm generated by the high-frequency generation unit 1b. The high-frequency output unit 9 outputs the high-frequency power Po based on the high-frequency signal Sm, amplitude of which has been controlled. The control unit 2b periodically controls the amplitude of the high-frequency signal Sm such that the magnitudes of the high-frequency powers Po output by the high-frequency output unit 9 are periodically adjusted to the first level and the second level in the first period and in the second period respectively. The second level is lower than the first level. Further, the control unit 2b gradually decreases or increases at least one of the duty ratio of the first period to the control cycle and the second level, and gradually increases or decreases the first level, while periodically controlling the amplitude. Therefore, the average value of the high-frequency power Po output by the high-frequency output unit 9 is kept constant. As a result, it is possible to mitigate a sudden change in the high-frequency power Po.

In addition, in Embodiment 2, the control unit 2b controls the amplitude of the high-frequency signal Sm generated by the high-frequency generation unit 1b in each of the first period and the second period. The high-frequency output unit 9 generates the high-frequency power Po having a magnitude corresponding to the high-frequency signal Sm, amplitude of which has been controlled. Therefore, it is possible to change the magnitudes of the high-frequency powers Po output in the first period and in the second period respectively to the first level and the second level respectively.

Embodiment 3

Embodiment 2 is an aspect in which one high-frequency output unit 9 supplies, to a load, the high-frequency power Po adjusted to the first level and the second level by amplitude shift keying. In Embodiment 3, one high-frequency output unit 9 supplies, to the load, high-frequency power Po1 at the first level only in the first period. Further, the other high-frequency output unit 9 supplies, to the load, high-frequency power Po2 at the second level only in the second period. One high-frequency output unit 9 corresponds to a first high-frequency output unit. The other high-frequency output unit corresponds to a second high-frequency output unit.

Figure 12:
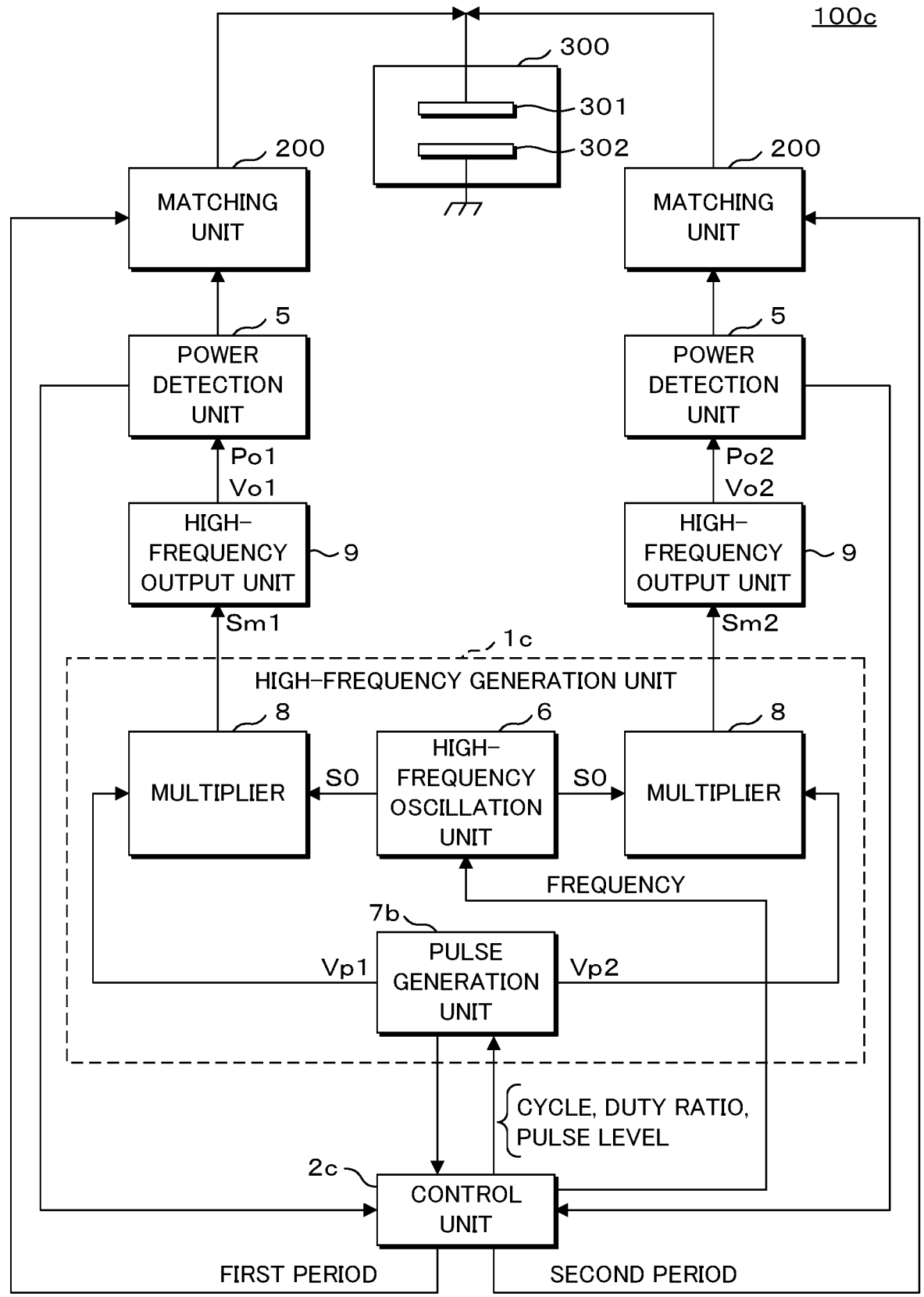
FIG. 12 is a block diagram illustrating an example of the configuration of a high-frequency power supply device according to Embodiment 3.

FIG. 12 is a block diagram illustrating an example of the configuration of a high-frequency power supply device 100c according to Embodiment 3. The high-frequency power supply device 100c includes a high-frequency generation unit 1c, a control unit 2c, and high-frequency output units 9. The high-frequency generation unit 1c generates high-frequency signals Sm1 and Sm2. The high-frequency signals Sm1 and Sm2 correspond to a first high-frequency signal and a second high-frequency signal respectively. The control unit 2c controls the amplitudes of the high-frequency signals Sm1 and Sm2 generated by the high-frequency generation unit 1c. One high-frequency output unit 9 outputs the high-frequency power Po1 having a magnitude corresponding to the high-frequency signal Sm1, amplitude of which has been controlled. The other high-frequency output unit 9 outputs the high-frequency power Po2 having a magnitude corresponding to the high-frequency signal Sm2, amplitude of which has been controlled.

The high-frequency power supply device 100c further includes power detection units 5 that detect the high-frequency power Po1 and the high-frequency power Po2 output by the high-frequency output units 9 respectively. The high-frequency power Po1 output by one high-frequency output unit 9 is supplied to an electrode 301 of a load 300 through one power detection unit 5 and one matching unit 200. The high-frequency power Po2 output by the other high-frequency output unit 9 is supplied to the electrode 301 of the load 300 through the other power detection unit 5 and the other matching unit 200. The matching units 200 achieve impedance matching with the load 300. The load 300 is a plasma processing apparatus. The other electrode 302 of the load 300 is grounded. Portions corresponding to those in Embodiments 1 and 2 are denoted by the same reference numerals and the description of the configuration thereof will be omitted.

The high-frequency generation unit 1c includes a high-frequency oscillation unit 6, a pulse generation unit 7b, and multipliers 8. The high-frequency oscillation unit 6 oscillates a high-frequency continuous signal S0. The pulse generation unit 7b generates pulse signals Vp1 and Vp2 for modulating the continuous signal S0 oscillated by the high-frequency oscillation unit 6. One multiplier 8 multiplies the continuous signal S0 oscillated by the high-frequency oscillation unit 6, by the pulse-signal Vp1 generated by the pulse generation unit 7b. As a result, the amplitude of the continuous signal S0 is modulated. The other multiplier 8 multiplies the continuous signal S0 oscillated by the high-frequency oscillation unit 6, by the pulse signal Vp2 generated by the pulse generation unit 7b. As a result, the amplitude of the continuous signal S0 is modulated.

The control unit 2c has a CPU, a ROM, and a RAM and has the similar configuration as the control unit 2b illustrated in FIG. in Embodiment 2. However, the detection results of the power detection units 5 are separately input to the control unit 2c. In addition, the control unit 2c notifies the matching units 200 of the timings related to the first period and the second period respectively. A signal indicating the first period and a signal indicating the second period may be directly given from the pulse generation unit 7b to the matching units 200 respectively.

The high-frequency oscillation unit 6 distributes the oscillated continuous signal S0 to the multipliers 8. Therefore, the continuous signal S0 is input to one multiplication input of each of the multipliers 8. It is noted that two continuous signals having different frequencies may be input to the multipliers 8 respectively.

The pulse generation unit 7b generates the high-level pulse signal Vp1 according to the cycle and duty ratio which are set by the control unit 2c. The pulse generation unit 7b inputs the generated pulse signal Vp1 to the other multiplication input of one multiplier 8. In addition, the pulse generation unit 7b generates the pulse signal Vp2 having a lower level than the pulse signal Vp1 in the off period of the pulse signal Vp1. The pulse generation unit 7b inputs the generated pulse signal Vp2 to the other multiplication input of the other multiplier 8. In other words, for the rectangular wave pulse signal Vp generated by the pulse generation unit 7 according to Embodiment 2, the pulse generation unit 7b outputs the pulse signal Vp1 in the first period and outputs the pulse signal Vp2 in the second period. The pulse signals Vp1 and Vp2 are pulse signals that are at a zero level in the off period in a narrow sense. The pulse generation unit 7b periodically notifies the control unit 2c of the start times of the generated pulse signals Vp1 and Vp2.

For convenience, the pulse generation unit 7b notifies the control unit 2c of two start times even in a case in which the duty ratio is set to 100%. As described above, the pulse generation unit 7b generates the pulse signals Vp1 and Vp2. Hereinafter, the on period of the pulse signal Vp1 is referred to as a first period. The on period of the pulse signal Vp2 is referred to as a second period. Further, the repetition cycle including the first period and the second period is referred to as a control cycle.

Each of the multipliers 8 performs amplitude shift keying on the high-frequency continuous signal S0. One multiplier 8 outputs the high-frequency signal Sm1. The other multiplier 8 outputs the high-frequency signal Sm2. The high-frequency output units 9 linearly amplify the high-frequency signals Sm1 and Sm2 respectively, the high-frequency signal Sm1 and Sm2 being output from the multipliers 8, that is, the high-frequency generation unit 1c. The high-frequency output units 9 output high-frequency voltages Vo1 and Vo2 obtained by the amplification respectively. Therefore, the high-frequency power Po1 and the high-frequency power Po2 which have magnitudes corresponding to the high-frequency voltages Vo1 and Vo2 respectively, are supplied to the load 300 side.

The above-mentioned configuration makes it possible for the control unit 2c to adjust the magnitude of the high-frequency power Po1 supplied to the load 300 to the first level during the first period. Further, the above-mentioned configuration makes it possible for the control unit 2c to adjust the magnitude of the high-frequency power Po2 supplied to the load 300 to the second level during the second period. The control unit 2c sets a pulse cycle and the duty ratio of the pulse signal Vp1 in the pulse generation unit 7b such that the start times of the first period and the second period are notified. The duty ratio is the ratio of the first period to the repetition cycle including the first period and the second period, that is, the control cycle. Therefore, for example, the pulse generation unit 7b performs an interrupt to periodically notify the control unit 2c of the start time of the first period and the start time of the second period.

In a case in which the start time of the first period is notified from the pulse generation unit 7b, the control unit 2c sets one pulse level in the pulse generation unit 7b such that the magnitude of the high-frequency power Po1 output from one high-frequency output unit 9 becomes the first level. In addition, in a case in which the start time of the second period is notified from the pulse generation unit 7b, the control unit 2c sets the other pulse level in the pulse generation unit 7b such that the magnitude of the high-frequency power Po2 output from the other high-frequency output unit 9 becomes the second level. The control unit 2c sets the pulse levels. The pulse level corresponding to the first level and the pulse level corresponding to the second level may be calculated in advance similarly as in Embodiment 2. In this case, two calculated values are stored in the storage unit (not illustrated). The pulse levels corresponding to the first level and the second level may be calculated whenever the setting is performed.

As described above, the high-frequency power Po1 and the high-frequency power Po2 are supplied from the high-frequency output units 9 to the load 300 in the first period and in the second period respectively. Feedback control can be performed such that the high-frequency power Po1 and the high-frequency power Po2 approach the target first level and the target second level. This configuration is the similar to those in Embodiments 1 and 2. In a case in which the first level or the second level is changed, the duty ratio of the first period is gradually decreased (or gradually increased) with the change in the first level or the second level, to keep the plasma stable. This configuration is the similar to those in Embodiments 1 and 2 and Modification Examples 1 and 2.

As described above, the content set in the pulse generation unit 7b by the control unit 2c is similar to the content set in the pulse generation unit 7 by the control unit 2b according to Embodiment 2. Therefore, the processing procedure of the control unit 2c that periodically sets the duty ratio and the pulse level in the pulse generation unit 7b is similar to the processing procedure illustrated in FIG. 11 in Embodiment 2. Therefore, the illustration and description of a flowchart indicating the processing procedure will be omitted here.

As described above, in Embodiment 3, the control unit 2c periodically controls the amplitudes of the high-frequency signals Sm1 and Sm2 generated by the high-frequency generation unit 1c. The high-frequency output units 9 output the high-frequency power Po1 and the high-frequency power Po2 based on the high-frequency signals Sm1 and Sm2, amplitudes of which have been controlled respectively.

The control unit 2c periodically controls the amplitudes of the high-frequency signals Sm1 and Sm2 such that the magnitudes of the high-frequency power Po1 and the high-frequency power Po2 are periodically adjusted to the first level and the second level in the first period and the second period respectively. In addition, the control unit 2c gradually decreases or increases at least the second level and one of the duty ratio of the first period to the control cycle, and gradually increases or decreases the first level, while periodically controlling the amplitudes. Therefore, the average value of the synthesis of the high-frequency power Po1 and the high-frequency power Po2 output by the high-frequency output units 9 is kept constant. That is, in a case in which at least one of the second level and the duty ratio of the first period is gradually decreased, the first level is gradually increased. In a case in which at least one of the second level and the duty ratio of the first period is gradually increased, the first level is gradually decreased. Therefore, the average value of the synthesis of the high-frequency power Po1 and the high-frequency power Po2 is kept constant. As a result, it is possible to mitigate a sudden change in the high-frequency power Po.

In Embodiment 3, the control unit 2c controls the amplitude of each of the high-frequency signals Sm1 and Sm2 in the similar manner as in Embodiment 2, to adjust the magnitudes of the high-frequency power Po1 and the high-frequency power Po2 supplied to the load 300 to the first level and the second level respectively. However, the configuration in which the magnitudes of two systems of high-frequency power supplied to the load 300 are adjusted to the first level and the second level respectively is not limited to the above-mentioned configuration. It is assumed that a set of high-frequency signals include two signals. For example, two sets of high-frequency signals may be generated instead of the high-frequency signals Sm1 and Sm2. In this configuration, for example, the control unit controls a phase difference for each set of high-frequency signals similarly as in Embodiment 1. Therefore, the magnitudes of two systems of high-frequency power supplied to the load 300 are adjusted to the first level and the second level respectively.

It is noted that, as used herein and in the appended claims, the singular forms "a", "an", and "the" include plural referents unless the context clearly dictates otherwise.

The disclosed embodiments are to be considered as illustrative in all points and not restrictive. The scope of the invention is shown not by the above-mentioned meanings but by the claims, and is intended to include meanings equivalent to the claims and all modifications within the scope. Further, the technical features described in embodiments can be combined with each other.

What is claimed is:

1. A high-frequency power supply device, comprising:
   a high-frequency generation unit that generates a high-frequency signal;
   a control unit that periodically controls an amplitude or phase of the high-frequency signal generated by the high-frequency generation unit; and
   a high-frequency output unit that outputs high-frequency power, magnitude of which is controlled on the basis of the high-frequency signal, the amplitude or phase of which is controlled by the control unit,
   wherein the control unit controls the amplitude or phase of the high-frequency signal such that the magnitude of the high-frequency power output by the high-frequency output unit is a first level in a first period of a control cycle and is a second level in a second period of the control cycle which is different from the first period, the second level being lower than the first level, the control unit gradually decreases or increases at least one of the second level and a ratio of a length of the first period to a length of the control cycle, in a case in which at least one of the second level and the ratio is gradually decreased, the control unit gradually increases the first level such that an average value of the high-frequency power output by the high-frequency output unit is constant, and in a case in which at least one of the second level and the ratio is gradually increased, the control unit gradually decreases the first level such that the average value of the high-frequency power output by the high-frequency output unit is constant.

2. The high-frequency power supply device according to claim 1, wherein the high-frequency generation unit generates a plurality of the high-frequency signals including a first high-frequency signal and a second high-frequency signal which have the same frequency, the control unit controls a phase difference between the first high-frequency signal and the second high-frequency signal in each of the first period and the second period, and the high-frequency output unit includes:

a first generation unit that generates a first high-frequency voltage having a phase corresponding to the first high-frequency signal;

a second generation unit that generates a second high-frequency voltage having a phase corresponding to the second high-frequency signal; and a power combination unit that combines high-frequency powers based on the first high-frequency voltage and the second high-frequency voltage respectively at a ratio corresponding to the phase difference, the first high-frequency voltage and the second high-frequency voltage being generated by the first generation unit and the second generation unit.

3. The high-frequency power supply device according to claim 1, wherein the control unit controls the amplitude of the high-frequency signal in each of the first period and the second period, and the high-frequency output unit outputs high-frequency power having a magnitude corresponding to the high-frequency signal, amplitude of which is controlled by the control unit.

4. The high-frequency power supply device according to claim 1, further comprising:

a power detection unit that detects the high-frequency power output by the high-frequency output unit, wherein the control unit adjusts the amplitude or phase of the high-frequency signal such that magnitudes of the high-frequency powers detected by the power detection unit in the first period and in the second period respectively are equal to the first level and the second level respectively.

5. A high-frequency power supply device comprising:

a high-frequency generation unit that generates a first high-frequency signal and a second high-frequency signal;

a control unit that periodically controls amplitudes or phases of the first high-frequency signal and the second high-frequency signal which are generated by the high-frequency generation unit;

a first high-frequency output unit that outputs high-frequency power, magnitude of which is controlled on the basis of the first high-frequency signal, the amplitude or phase of which is controlled by the control unit; and a second high-frequency output unit that outputs high-frequency power, magnitude of which is controlled on the basis of the second high-frequency signal, the amplitude or phase of which is controlled by the control unit, wherein the control unit controls the amplitude or phase of the first high-frequency signal such that the magnitude of the high-frequency power output by the first high-frequency output unit is a first level in a first period of a control cycle, the control unit controls the amplitude or phase of the second high-frequency signal such that the magnitude of the high-frequency power output by the second high-frequency output unit is a second level in a second period of the control cycle which is different from the first period, the second level being lower than the first level, the control unit gradually decreases or increases at least one of the second level and a ratio of a length of the first period to a length of the control cycle, in a case in which the at least one of the second level and the ratio is gradually decreased, the control unit gradually increases the first level such that an average value of a synthesis of the high-frequency powers output by the first high-frequency output unit and the second high-frequency output unit is constant, and in a case in which the at least one of the second level and the ratio is gradually increased, the control unit gradually decreases the first level such that the average value of the synthesis of the high-frequency powers output by the first high-frequency output unit and the second high-frequency output unit is constant.

6. An output method of high-frequency power, magnitude of which is controlled on the basis of a high frequency signal, an amplitude or phase of which is controlled periodically, the output method comprising:

controlling the amplitude or phase of the high-frequency signal such that the magnitude of the high-frequency power is a first level in a first period of a control cycle and is a second level in a second period of the control cycle which is different from the first period, the second level being lower than the first level;

gradually decreasing or increasing at least one of the second level and a ratio of a length of the first period to a length of the control cycle;

gradually increasing the first level such that an average value of the high-frequency power is constant in a case in which the at least one of the second level and the ratio is gradually decreased; and gradually decreasing the first level such that the average value of the high-frequency power is constant in a case in which the at least one of the second level and the ratio is gradually increased.

* * * * *